(12) United States Patent
Hiraishi et al.

(10) Patent No.: US 6,181,062 B1
(45) Date of Patent: *Jan. 30, 2001

(54) MULTIPLE LAYERED ORGANIC ELECTROLUMINESCENT DEVICE STRUCTURE WITH PLURAL TRANSPARENT ELECTRODE, COLOR FILTERS AND ORGANIC/INORGANIC TRANSPARENT COATING TO ENHANCE LIGHT DIFFUSION EFFECTS

(75) Inventors: Hisato Hiraishi, Tokyo; Ayako Kazama, Niiza, both of (JP)

(73) Assignee: Citizen Watch Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/930,976

(22) PCT Filed: Apr. 19, 1996

(86) PCT No.: PCT/JP96/01068

§ 371 Date: Oct. 15, 1997

§ 102(e) Date: Oct. 15, 1997

(87) PCT Pub. No.: WO96/34514

PCT Pub. Date: Oct. 31, 1996

(30) Foreign Application Priority Data

Apr. 25, 1995 (JP) .................................................... 7-099092
May 16, 1995 (JP) .................................................... 7-116700
Aug. 16, 1995 (JP) .................................................... 7-208801

(51) Int. Cl.[7] ...................................................... H01J 1/62
(52) U.S. Cl. ........................ 313/504; 313/503; 313/506; 313/509; 313/112
(58) Field of Search ................................. 313/504, 503, 313/506, 509, 112

(56) References Cited

U.S. PATENT DOCUMENTS 4,792,500 * 12/1988 Kojima ................................. 428/690
5,073,446 * 12/1991 Scozzafava et al. ................. 313/504
5,606,462 * 2/1997 Tsuruoka et al. .................... 313/112
5,652,067 * 7/1997 Ito et al. ............................... 313/504
5,702,833 * 12/1997 Nagai et al. .......................... 313/504
5,705,285 * 1/1998 Shi et al. .............................. 313/504
5,744,233 * 4/1998 Opitz et al. ........................... 313/503

FOREIGN PATENT DOCUMENTS

| 57-28198 | 6/1982 | (JP) . |
| 62-182789 | 8/1987 | (JP) . |
| 63-182097 | 11/1988 | (JP) . |
| 2-100288 | 4/1990 | (JP) . |
| 3-297090 | 12/1991 | (JP) . |
| 6-5367 | 1/1994 | (JP) . |
| 6-338391 | 12/1994 | (JP) . |

* cited by examiner

Primary Examiner—Sandra O'Shea
Assistant Examiner—Ronald E. DelGizzi
(74) Attorney, Agent, or Firm—Armstrong, Westerman, Hattori, McLeland & Naughton

(57) ABSTRACT

An organic electroluminescent body is formed by a transparent electrode formed on the front surface of an organic luminescent layer, which emits light when a voltage is applied thereto, and a metal electrode formed on the back surface of the organic luminescent layer. An organic electroluminescent device including the organic electroluminescent body is structured to include a transparent electrode formed on the back surface of a transparent substrate, and a diffusing plate having light diffusion characteristics formed on the front surface of the transparent substrate.

Since the diffusing plate is formed on the front surface of the transparent substrate, part of an external incident light is reflected diffusedly by the front side of or within the diffusing plate, and the rest of the light travels through the diffusing plate when the organic electroluminescent body does not emit the light (when light is not emitted). The light traveling through the diffusing plate is reflected by the metal electrode, and enters the diffusing plate again, then it is diffused. As a result, a mirror of the metal electrode is not visually perceived from outside.

29 Claims, 15 Drawing Sheets

MULTIPLE LAYERED ORGANIC ELECTROLUMINESCENT DEVICE STRUCTURE WITH PLURAL TRANSPARENT ELECTRODE, COLOR FILTERS AND ORGANIC/INORGANIC TRANSPARENT COATING TO ENHANCE LIGHT DIFFUSION EFFECTS

TECHNICAL FIELD

The present invention relates to the structure of an organic electroluminescent device.

BACKGROUND TECHNOLOGY

An electroluminescent device includes an inorganic electroluminescent device and an organic electroluminescent device. The inorganic electroluminescent device includes a thin film type and a dispersion type both of which generally require a high AC voltage having several tens of V or more for emitting light. On the other hand, the organic electroluminescent device has an effect that it can emit light with high luminance at a DC voltage of 10 V or less.

The organic electroluminescent device is generally formed of a luminescent body (organic electroluminescent body) comprising a transparent electrode, an organic luminescent layer, and a metal electrode which are laminated in that order on a transparent substrate.

The organic luminescent layer is formed of a laminated body of various organic thin films, for example, there is known a body having various combinations of layers such as a laminated layer formed of a hole injection layer made of triphenylamine derivative and a luminescent layer made of fluorescent organic solid such as anthracene, a laminated layer formed of such a luminescent layer and an electron injection layer made of perylene derivative, and a laminated layer formed of a hole injection layer, the luminescent layer and the electron injection layer set forth above.

The organic electroluminescent device emits light based on the following principle. That is, when the voltage is applied to the transparent electrode and metal electrode, holes and electrons are injected into the organic luminescent layer, wherein the holes and electrons are recombined to generate energy, which energy excites the fluorescent material, and the organic electroluminescent device emits light when the excited fluorescent material returns to the ground state.

The mechanism of recombination of the holes and electrons in the course of emitting light is similar to that of ordinary light emitting diodes, so that the current and also the luminescent intensity exhibit non-linear characteristics with respect to the applied voltage. This results in rectification characteristics of the organic electroluminescent device.

In the organic electroluminescent device, at least one of the electrodes must be transparent for permitting light to travel outside, so that the transparent electrode formed of a transparent conductor made of indium tin oxide (ITO) is generally employed as an anode.

To enhance luminous efficiency by facilitating the injection of electrons, it is important to employ material having a lower work function as a cathode, and hence a metal electrode made of Mg—Ag, or Al—Li is normally employed.

In such an organic electroluminescent device having the arrangement set forth above, the organic luminescent layer is formed of a very thin film having a thickness of about 100 nm. Accordingly, the organic luminescent layer as well as the transparent electrode is substantially transparent. Consequently, when the organic electroluminescent device is turned off, environmental light transmits through the transparent substrate, the transparent electrode and the organic luminescent layer, then it is reflected by the metal electrode, and successively is ejected from the front surface of the transparent substrate. As a result, the display area of the organic electroluminescent device looks like a mirror.

In case that the organic electroluminescent device is employed as a light emitting element or a display element, it is very unnatural for the display area to look like a mirror when the device is turned off, and hence the use of this device is remarkably limited. This problem becomes particularly serious under conditions of a bright environment.

DISCLOSURE OF THE INVENTION

The present invention has been made to solve the problems of the prior art organic electroluminescent device, and it is a main object to prevent a display area from looking like a mirror, which is caused by the light reflection by the metal electrode when the device is turned off.

To achieve the above object, a first aspect of the invention comprises an organic electroluminescent device comprising an organic electroluminescent body (hereinafter occasionally abbreviated as an organic EL body) which emits light when a voltage is applied thereto, including a transparent electrode formed on the front surface of an organic luminescent layer and a metal electrode formed on the back surface of the organic luminescent layer, wherein the transparent electrode of the organic electroluminescent body is formed on the back surface of a transparent substrate, and a diffusing plate having light diffusion characteristics is formed on the front surface of the transparent substrate.

In the specification and claims, the "front surface" of each component is a surface of the viewing side of the display area, while the "back surface" is a surface which is opposite to the front surface (surface close to the metal electrode).

As the diffusing plate, a thin ceramic plate can be employed. As mentioned above, according to the present invention having the diffusing plate formed on the front surface of the transparent substrate, and when the driving voltage is not applied to the organic EL body (when light is not emitted), a part of external incident light is reflected diffusedly by the front side of or within the diffusing plate and the rest of the light travels through the diffusing plate. The light traveling through the diffusing plate is reflected by the metal electrode, and reenters the diffusing plate, then it is diffused again. As a result, there is an advantage that a mirror originated in the metal electrode is not visually perceived from outside.

The first aspect of the invention can provide a color filter which transmits light having a given distribution of transmittancy to the wavelength of light or emitting fluorescence having a given distribution of intensity to the wavelength of light, and which is formed on the front side of the diffusing plate or between the diffusing plate and the transparent substrate.

When the organic EL body does not emit light, the mirror of the metal electrode is screened by the diffusing plate, and, since the color filter is provided, the entire display area appears in the color of the color filter. This is caused by the fact that the diffusing plate is milk white and does not have wavelength sensitive characteristics, and it functions as a kind of reflecting panel when the organic EL body does not emit light.

When the organic EL body emits light, it is possible to visually perceive a color of the light, in which the spectral curve is obtained by overlapping a spectral curve of the light emitted from the organic EL body and a spectral curve of the transmittancy of the color filter, thereby realizing a variety of colors on the display area.

It is also possible to realize a variety of colors on a display area by not providing the color filter but by coloring the diffusing plate with an arbitrary color.

In the first aspect of the invention, the transparent electrode may be divided into plural segments to form plural transparent electrodes, and a screening layer for screening light may be formed between the transparent substrate and the diffusing plate. The portions of the screening layer formed at least the area except at least that confronts the plural transparent electrodes.

The plural transparent electrodes are arranged in an arbitrary pattern representing characters, numerals, symbols, etc., wherein each transparent electrode arranged in respective arbitrary patterns can emit light independently and display certain patterns when selected electrodes are energized.

The light emitted from the organic EL body radiates radially while traveling through the transparent substrate. However, since a screening layer is formed on the front surface of the transparent substrate only the light which passes through the gaps of the screening layer enters the diffusing plate and then is ejected from the front side thereof.

That is, the light emitted from the organic EL body is controlled and reshaped by the screening layer, thereby making the outline of the luminescent display pattern clear.

Even in the first aspect of the invention having such an arrangement, it is also possible to realize a variety of colors on the display area by providing the color filter, which transmits light having a given distribution of transmittancy to the wavelength of light or emits fluorescence having a given distribution of intensity to the wavelength of light, on the front side or back side of the diffusing plate.

Further, color filters, which transmit the light having a given distribution of transmittancy to the wavelength of light or emit fluorescence having a given distribution of intensity to the wavelength of light, may be provided in the gaps of the screening layer confronting the plural transparent electrodes.

Still further, if the screening layer comprises a reflecting layer for reflecting light and an absorbing layer for absorbing light, wherein the reflecting layer is arranged on the front surface and the absorbing layer is arranged on the back surface, the luminescent display pattern of the organic EL body can be clearer when light is emitted and the entire display area can be uniform in color and brightness when light is not emitted.

That is, if the back surface of the absorbing layer has reflective characteristics, the light emitted from the organic EL body and radiated radially while traveling through the transparent substrate is reflected by the back surface of the screening layer. The reflected light enters the metal electrode, then it is reflected again by the metal electrode, and part of the again reflected light leaks out from the gaps of the screening layer.

Consequently, the luminescent display pattern of the organic EL body is not clear, thereby deteriorating the display quality. The absorbing layer formed on the back surface of the screening layer prevents such a disadvantage.

On the other hand, the environmental light enters the front side of the diffusing plate, passes through the gaps of the screening layer, and is reflected by the metal electrode, then passes again through the gaps of the screening layer, and travels through the diffusing plate to be permitted to be ejected from the front side thereof when the organic electroluminescent device is turned off. The mirror of the metal electrode thus can not be visually perceived from outside owing to the diffusing plate.

However, if the reflected light from the metal electrode, which enters the diffusing plate, comes from the gaps of the screening layer only, the light is not sufficiently diffused on the entire area of the diffusing plate, so that the front side of the diffusing plate is not uniform in its color and brightness. Especially under bright circumstances, the luminescent display pattern of the organic EL body can be recognized even when light is not emitted.

Whereupon, when the light, whose quantity is equivalent to the light reflected from the metal electrode which passes through the gaps of the screening layer, is reflected by the reflecting layer, the entire area of the diffusing plate is uniform in color and brightness.

Meanwhile, the diffusing plate may be formed of a transparent plate having transmittance characteristics and a thin film diffusing layer formed on the back side of the transparent plate. If the diffusing layer having such light diffusion characteristics is formed of a thin film, it is possible to keep the outline of the luminescent display pattern of the organic EL body from being blurred, due to the light diffusion when the emitted light from the organic EL body travels through the diffusing plate, so as to make the outline of the luminescent display pattern more clear.

A color filter, which transmits or emits light having a given distribution of transmittancy to the wavelength of light, may be also provided on the front or back side of the transparent plate.

The second aspect of the invention is structured to include the transparent electrode of the organic EL body formed on the back side of the diffusing plate having light diffusion characteristics. That is, the second aspect of the invention is structured to dispense with the transparent substrate of the first aspect of the invention.

The diffusing plate may employ a ceramic plate having a thickness and strength serving as a substrate. According to the second aspect of the invention, the structure may be thinned by the thickness of the transparent substrate since the transparent substrate is omitted.

According to the second aspect of the invention, it is also possible to prevent the mirror of the metal electrode from being visible from the outside of the device since the reflected light from the metal electrode can be diffused by the diffusing plate when the organic EL body does not emit light.

According to the second aspect of the invention, likewise the first aspect of the invention, it is possible to provide a color filter, which transmits light having a given distribution of transmittancy to the wavelength of light or emits the fluorescence having a given distribution of intensity to the wavelength of light, on the front or back side of the transparent plate.

It is also possible to realize a variety of colors on a display area by not providing the color filter but by coloring a diffusing plate with an arbitrary color.

The third aspect of the invention is structured to include the transparent electrode of the organic EL body which is formed on the back surface of the transparent substrate, and a thin film diffusing layer which has the light diffusion characteristics and is formed between the transparent substrate and the transparent electrode.

The third aspect of the invention also has an effect that a mirror of the metal electrode is not visually perceived from outside owing to the light diffusion operation by the diffusing layer.

The transparent electrode may be formed by being divided into plural segments to form the plural transparent electrodes.

It is also possible to provide a color filter, which transmits light having a given distribution of transmittancy to the wavelength of light or emits fluorescence having a given distribution of intensity to the wavelength of light, on the front surface of the transparent substrate or between the transparent substrate and the diffusing plate.

Meanwhile, the diffusing plate may be colored with an arbitrary color instead of providing the color filter. It is also possible to realize a variety of colors on a display area by providing the color filter or coloring the diffusing plate.

A transparent coating layer for smoothing the surface on which the transparent electrode is formed may be provided on the back side of the diffusing plate. That is, there is a likelihood of occurrence of electronic short between the transparent electrode and the metal electrode if the surface on which the transparent electrode is formed is rough since the organic luminescent layer constituting the organic EL body is generally very thin. In view of preventing such a drawback, it is preferable to smooth the back surface of the diffusing layer by the transparent coating layer.

The transparent coating layer may be formed of an organic transparent coating layer which is made of organic material having acid resistance and an inorganic transparent coating layer which is made of inorganic material and formed on the back surface of the organic transparent coating layer. If the transparent coating layer is double-structured as described above, the organic transparent coating layer smoothes the back side of the diffusing plate and the inorganic transparent coating layer enhances the etching performance of the transparent electrode.

It is also possible to realize a variety of colors formed on a display area by providing color filters, which transmit light having a given distribution of transmittancy to the wavelength of light or emit fluorescence having a given distribution of intensity to the wavelength of light, between the diffusing plate and the transparent coating layer, at least at portions confronting the plural transparent electrodes. Uneven portions are formed on the back side of the diffusing plate by the formation of the color filters. The transparent coating layer prevents the formation of the uneven portions and smoothes the surface on which the organic EL body is formed.

Further, if plural kinds of color filters, which transmit light having different distribution of intensity to the wavelength of light or emit fluorescence having different distribution of transmittancy to the wavelength of light, are employed as the color filters set forth above, plural colors are displayed, leading to the realization of a greater variety of colors on a display area.

Meanwhile, a transparent sheet comprising a thin plate of glass may be provided between the diffusing layer and the transparent electrode instead of providing the transparent coating layer set forth above.

Further, if color filters, which transmit light having a given distribution of transmittancy to the wavelength of light or emit fluorescence having a given distribution of intensity to the wavelength of light, are provided between the diffusing layer and the transparent sheet at least at portions confronting the plural transparent electrodes, and adhesive is filled around the color filters to thereby bond the transparent sheet, it is also possible to realize a variety of colors on a display area, in the same way as the color filter added to the organic electroluminescent device having the transparent coating layer set forth above.

If plural kinds of color filters, which transmit light having different distribution of intensity to the wavelength of light or emit fluorescence having different distribution of transmittancy to the wavelength of light, are employed as the color filters set forth above, plural colors are displayed, leading to the realization of a greater variety of colors on a display area.

The fourth aspect of the invention is an organic electroluminescent device comprising an organic EL body, a transparent substrate formed on the front side of the transparent electrode, and a thin film diffusing layer, which has light diffusion characteristics and formed on the back surface of the transparent substrate, wherein an interface between the transparent substrate and the diffusing layer is made rough so as to reflect light irregularly.

The fourth aspect of the invention also has an effect that a mirror of the metal electrode is not visually perceived from outside owing to the light diffusion by the diffusing layer.

Further, according to the fourth aspect of the invention, mirror reflection of light which was liable to occur at the interface between the transparent substrate and the diffusing layer can be prevented by making the interface rough, so that the display area looks more soft.

The fifth aspect of the invention is an organic electroluminescent device comprising an organic EL body consisting of a transparent electrode formed on the front surface of an organic luminescent layer, which emits light when a voltage is applied, and a metal electrode formed on the back surface of the organic luminescent layer, and a transparent substrate formed on the front side of the transparent electrode, a thin film diffusing layer formed on the front side of the transparent electrode and the back surface of the transparent substrate, and a color filter, which transmits light having a given distribution of transmittancy to the wavelength of light or emits fluorescence having a given distribution of intensity to the wavelength of light, formed on at least one of the surfaces of the back of the transparent substrate or the front surface of the diffusing layer, wherein at least one of the interfaces between the transparent substrate and the color filter or the diffusing layer and the color filter is made rough so as to reflect light irregularly.

The fifth aspect of the invention, likewise the fourth aspect of the invention, also has an effect that a mirror of the metal electrode is not visually perceived from outside owing to the light diffusion by the diffusing layer.

Further, mirror reflection of light which was liable to occur at either the interface between the transparent substrate and the color filter or the interface between the diffusing layer and the color filter can be prevented by making the interface rough, so that a display area looks more soft.

The sixth aspect of the invention is an organic electroluminescent device comprising an organic EL body including a transparent electrode formed on the front surface of an organic luminescent layer, which emits light when a voltage is applied, and a metal electrode formed on the back surface of the organic luminescent layer, wherein a polarizing plate is formed on the front side of the transparent electrode and a phase plate is formed between the transparent electrode and the polarizing plate.

Since the phase plate and the polarizing plate operate to polarize the light which enters from outside and is reflected by the metal electrode, there is an effect that a mirror of the metal electrode is not visually perceived from outside owing to the polarization of light.

Particularly, when the phase plate is formed of a ¼ wavelength plate and the angle between the polarization direction of the polarizing plate and that of the phase plate is adjusted to $\pi/4$, the mirror of the metal electrode can be completely screened.

That is, external light that can pass the polarizing plate to the organic EL body is a component of linearly polarized light alone. Linearly polarized light changes to elliptically polarized light by the phase plate, and in the case that the phase plate is a ¼ wavelength plate and the angle between the polarization direction of the polarizing plate and that of the phase plate is adjusted to $\pi/4$, elliptically polarized light becomes circularly polarized.

The circularly polarized light travels through the transparent substrate, the transparent electrode, and the organic luminescent layer, and it is reflected by the metal electrode, then travels again through the organic luminescent layer, the transparent electrode and the transparent substrate, and it is finally changed again to linearly polarized light by the phase plate.

Since the polarization direction of this linearly polarized light is perpendicular to that of the polarizing plate, the light does not pass through the polarizing plate. As a result, the mirror of the metal electrode can be completely screened.

BEST MODE FOR CARRYING OUT THE INVENTION

Preferred embodiments of the present invention will be now described with reference to the attached drawings for explaining the content of the present invention more in detail.

[First Embodiment]

Figure 1:
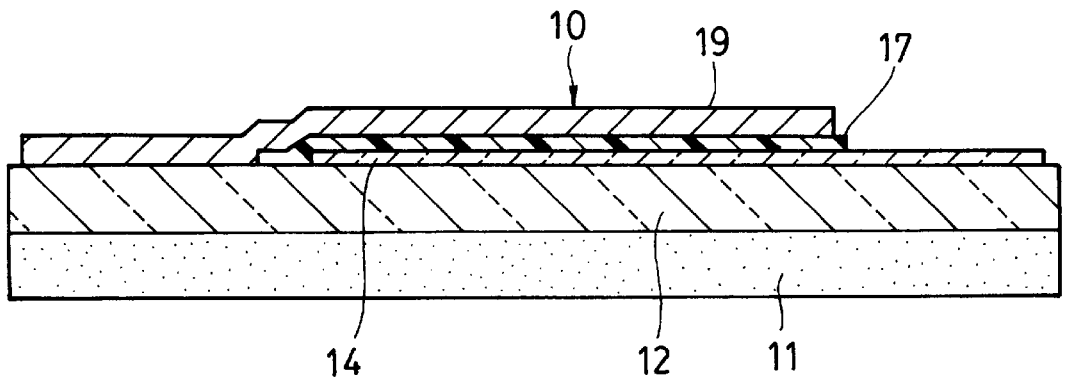
FIG. 1 is a cross sectional view of an organic electroluminescent device according to a first embodiment of the present invention.

FIG. 1 is a cross sectional view showing an organic electroluminescent device according to a first embodiment of the present invention.

The organic electroluminescent device is formed of an organic electroluminescent body (organic EL body 10) comprising a transparent electrode 14, an organic luminescent layer 17, and a metal electrode 19.

The organic EL body 10 is formed on the back surface of a transparent substrate 12. A diffusing plate 11 is formed on the front surface of the transparent substrate 12 for performing the diffusion of light.

That is, the transparent electrode 14, the organic luminescent layer 17 and the metal electrode 19 are subsequently laminated in that order on the back surface of the transparent substrate 12 which is made of non-alkali glass having a thickness of 0.5 mm, and the diffusing plate 11 having a thickness of 0.2 mm is bonded onto the front surface of the transparent substrate 12.

The transparent electrode 14 employs, for example, indium tin oxide (ITO). The transparent electrode 14 is formed in a given pattern by firstly forming a thin film having a thickness of about 100 nm on the front surface of the transparent substrate 12 by a sputtering technique, then by secondly subjecting the thin film to the photolithographic etching process.

The organic luminescent layer 17 is formed on the back surface of the transparent electrode 14 by a vacuum evaporation technique, and it comprises a hole injection layer having a thickness of 60 nm made of, for example, triphenylamine derivative, and a luminescent layer having a thickness of 60 nm made of, for example, aluminium chelate complex wherein the entire thickness of organic luminescent layer 17 becomes 120 nm. When the organic luminescent layer 17 is formed of material set forth above, it emits green light when a voltage is applied thereto.

The metal electrode 19 is made of, for example, Mg—Ag (Ag content is 5%), and it is formed in the thickness of about 150 nm on the back surface of the organic luminescent layer 17 by multiple evaporation technique.

In the first embodiment, the diffusing plate 11 employs a thin alumina ceramic plate having a thickness of 0.2 mm. In general, it is easy to have the thin ceramic plate obtain desired transmittancy and diffusion characteristics of light by adjusting the crystal structure thereof. In the first embodiment, the thin ceramic plate having milk white color with the transmittancy of 60%, is prepared and employed as the diffusing plate 11.

In this embodiment, since the diffusing plate 11 is formed on the front surface of the transparent substrate 12, part of the external incident light is reflected diffusedly by the front side of or within the diffusing plate 11, and rest of the light travels through the diffusing plate 11 when the driving voltage is not applied to the organic EL body 10 (when light is not emitted). The light passed through the diffusing plate is reflected by the metal electrode 19, and enters the diffusing plate 11, where it is diffused again.

Accordingly, when one sees the front side of the diffusing plate 11, it looks milk-white. That is, the diffusing plate screens the mirror of the metal electrode 19 and makes it invisible.

Further, when the driving voltage is applied to the organic EL body 10 (when light is emitted), the green emitted light is diffused by the diffusing plate 11 so that the entire diffusing plate 11 is visually perceived as a green uniform luminescent surface.

Figure 2:
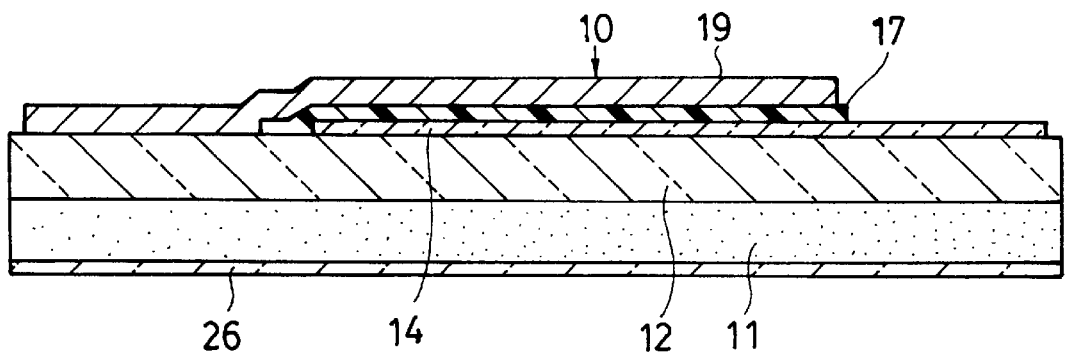
FIG. 2 is a cross sectional view of a modified example (modified example 1-1) of the first embodiment shown in FIG. 1.

FIG. 2 is a cross sectional view of a modified example of the first embodiment in FIG. 1 (modified example 1-1). In addition to the same components as shown in FIG. 1, the organic electroluminescent device in FIG. 2 is structured to include a color filter 26 on the front side of the diffusing plate 11.

The color filter 26 is, for example, made of gelatin dyed by green azo-type acid dyestuff, and is formed on the front side of the diffusing plate 11 having a thickness of 1 $\mu$m.

It is preferable that the color filter 26 is formed of a transparent structure having no light diffusion characteristics. The color filter 26 is not strictly controlled in its thickness, and preferably has a thickness of about several microns.

In the structure of the modified example 1-1 having the color filter 26, the mirror of the metal electrode 19 is screened by the diffusing plate 11 when the organic EL body 10 does not emit light, so that the entire display area (front side of the diffusing plate 11) appears in the color (e. g. green color) of the color filter 26. This is caused by the fact that the diffusing plate 11 is milk white and has no wavelength sensitive characteristics, and it functions as a kind of reflecting plate when the organic EL body 10 does not emit light.

When the organic EL body 10 emits light, the visually perceived color at the display area (green in the aforementioned structure) is regulated by the spectral curve obtained by overlapping a spectral curve of the luminescence, i.e. the light emitted from the organic EL body 10, and a spectral curve of the transmittancy of the color filter 26.

If the spectral curve of the luminescence of the organic EL body 10 substantially conforms to the spectral curve of the transmittancy of the color filter 26 (that is, to make them similar in color), the color of light is perceived to be substantially the same as the luminescent color of the organic EL body 10. In this case, the emitted light is hardly absorbed by the color filter 26. As a result, luminescence of the organic EL body 10 is effectively utilized and a luminescent display having high luminance can be obtained.

As the color filter 26, it is also possible to employ, for example, resins such as polyimide or acrylic resin in which an organic pigment is dispersed.

Further, it is possible to obtain the color filter 26 which is excellent in durability if the inorganic pigment dispersed in glass material is formed on the diffusing plate 11 by baking at high temperature.

Figure 3:
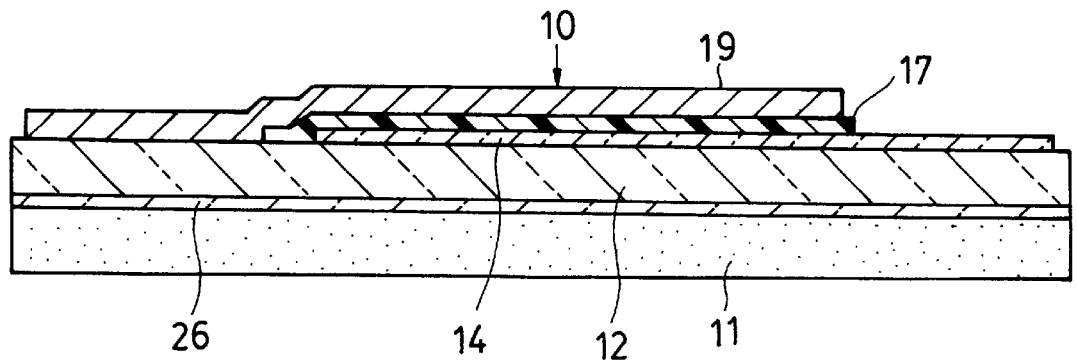
FIG. 3 is a cross sectional view of another modified example (modified example 1-2) of the first embodiment shown in FIG. 1.

FIG. 3 is a cross sectional view of another modified example (modified example 1-2) of the first embodiment shown in FIG. 1.

In addition to the same components as shown in FIG. 1, the organic electroluminescent device shown in FIG. 3 is structured to include the color filter 26 formed between the diffusing plate 11 and the transparent electrode 14. The color filter 26 may be formed on the front surface of the transparent substrate 12 or may be otherwise formed on the back side of the diffusing plate 11.

In the modified example 1-2, the color filter 26 is formed by doping a fluorescent substance into a polymer film such as acrylic resin. When the organic electroluminescent device emits light, the color to be visually perceived at the front surface (display area) is determined by the luminescent color of the organic EL body 10 and optical characteristics of the color filter 26. That is, if a fluorescent substance having characteristics to emit fluorescence of a desired color is selected as a dopant for the color filter 26, the desired color of luminescence can be obtained. In this case the color of luminescence is variable even if only one kind of organic EL body 10 is employed since the color which is visually perceived is the luminescent color of the fluorescent substance.

For example, the organic EL body 10 formed emits light of shorter wavelengths (e.g. blue light). If the dopant of the color filter 26 is selected to be a fluorescent substance which absorbs blue light, such as the luminescence film the organic EL body 10, and emits fluorescent light having an arbitrary color, such as green or red, the luminescent color of the fluorescent substance can be visually perceived from the outside.

In the arrangement of the modified example 1-2, the diffusing plate 11 is exposed on the front surface (display area) of the organic electroluminescent device. Accordingly, the display area appears substantially in milk white due to the light diffusion by the diffusing plate 11 when light is not emitted.

The color filter 26 formed in the modified example 1-1 may be applied to the modified example 1-2 and, vice versa, the color filter 26 formed in the modified example 1-2 may be applied to the modified example 1-1.

[Second Embodiment]

Figure 4:
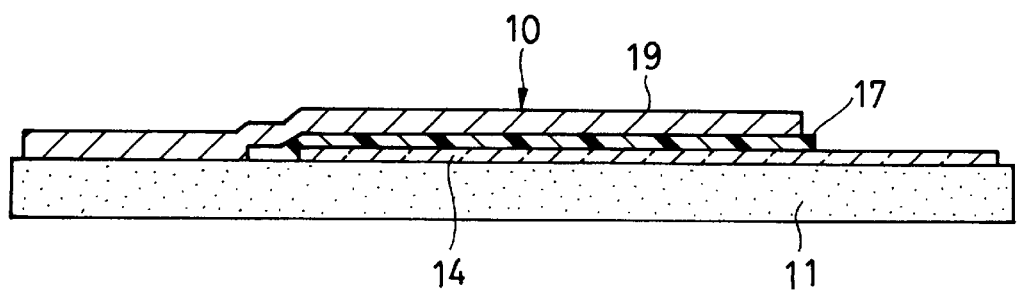
FIG. 4 is a cross sectional view of an organic electroluminescent device according to a second embodiment of the present invention.

FIG. 4 is a cross sectional view of an organic electroluminescent device according to a second embodiment of the present invention.

The organic electroluminescent device is formed of an organic electroluminescent body (organic EL body) 10 comprising a transparent electrode 14, an organic luminescent layer 17, and a metal electrode 19, wherein the organic EL body 10 is formed on the back side of a diffusing plate 11. That is, the second embodiment is structured to dispense with the transparent substrate 12 (see FIG. 1) of the first embodiment.

The diffusing plate 11 can employ, for example, a thin alumina ceramic plate having a transmittancy of about 60% and a thickness of 0.2 mm. The back side of the diffusing plate 11 is subject to an optical grinding, etc., so as to obtain a smooth surface so that the organic EL body 10 can be formed without defects.

Meanwhile, since the arrangement of the organic EL body 10 is the same as that of the first embodiment, the detailed explanation thereof is omitted.

According to the second embodiment, since the transparent substrate 12 is dispensed with, the organic electroluminescent device can be thinned by the thickness of the transparent substrate 12. The second embodiment having such a thin structure is much more desirable when it is incorporated into a narrower space, which is limited in its thickness, for example, when it is incorporated into a wrist watch for illuminating the dial thereof.

Even in the second aspect of the invention, it is possible to screen the mirror of the metal electrode 19 since the reflected light from the metal electrode 19 is diffused by the diffusing plate 11 when the organic EL body 10 does not emit light.

Figure 5:
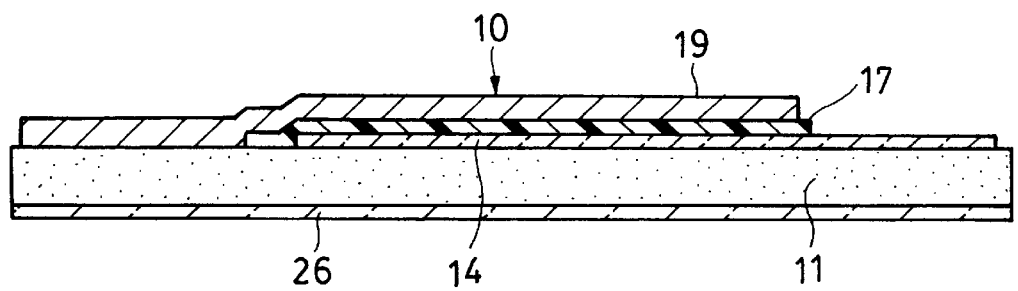
FIG. 5 is a cross sectional view of a modified example (modified example 2-1) of the second embodiment shown in FIG. 4.

FIG. 5 is a cross sectional view of a modified example (modified example 2-1) of the second embodiment shown in FIG. 4.

In addition to the same components as shown in FIG. 4, the organic electroluminescent device in FIG. 5 is structured to include a color filter 26 on the front side of the diffusing plate 11.

Figure 6:
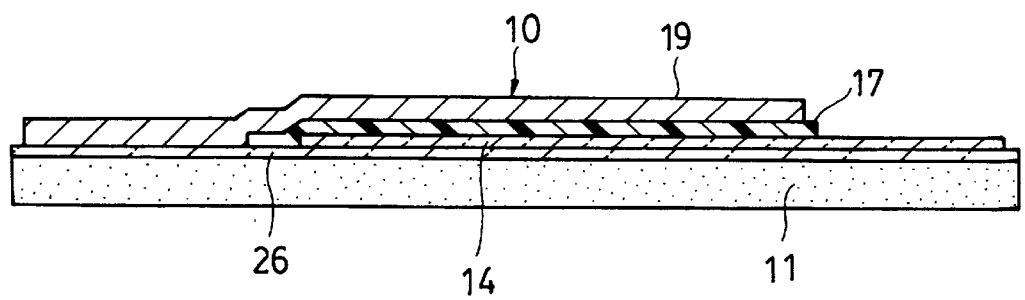
FIG. 6 is a cross sectional view of another modified example (modified example 2-2) of the second embodiment shown in FIG. 4.

FIG. 6 is a cross sectional view of another modified example (modified example 2-2) of the second embodiment shown in FIG. 4.

In addition to the same components as those shown in FIG. 4, the organic electroluminescent device in FIG. 6 is structured to include the color filter 26 formed between the diffusing plate 11 and the transparent electrode 14.

The arrangement and operation of the color filter 26 in each of these modified examples are the same as those explained in the modified example 1-1 or 1-2 of the first embodiment, whereby color of the display area of the organic electroluminescent device can be arbitrarily set by the color filter 26 whenever the organic electroluminescent device emits light or not.

When the color filter 26 is formed on the back side of the diffusing plate 11 as explained in the modified examples 1-2 and 2-2, it is possible to employ a dichroic mirror as the color filter 26.

[Third Embodiment]

Figure 7:
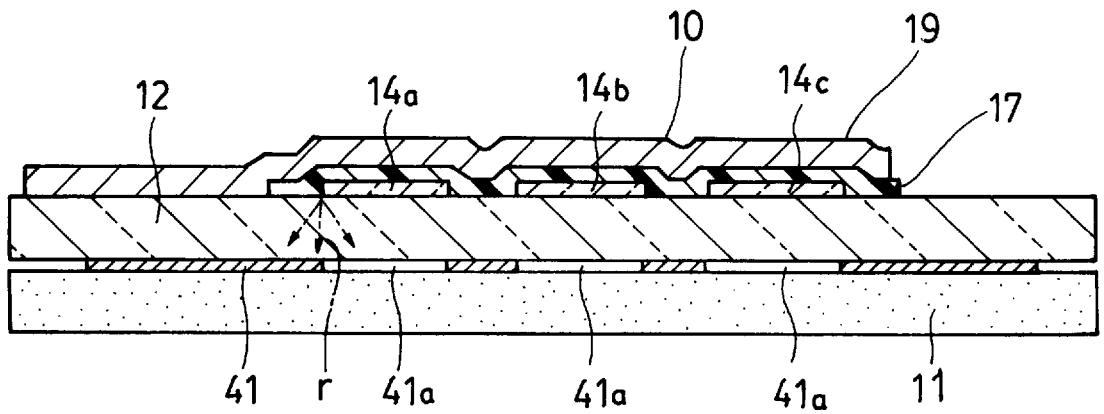
FIG. 7 is a cross sectional view of an organic electroluminescent device according to a third embodiment of the present invention.

FIG. 7 is a cross sectional view of an organic electroluminescent device according to a third embodiment of the present invention.

Figure 8:
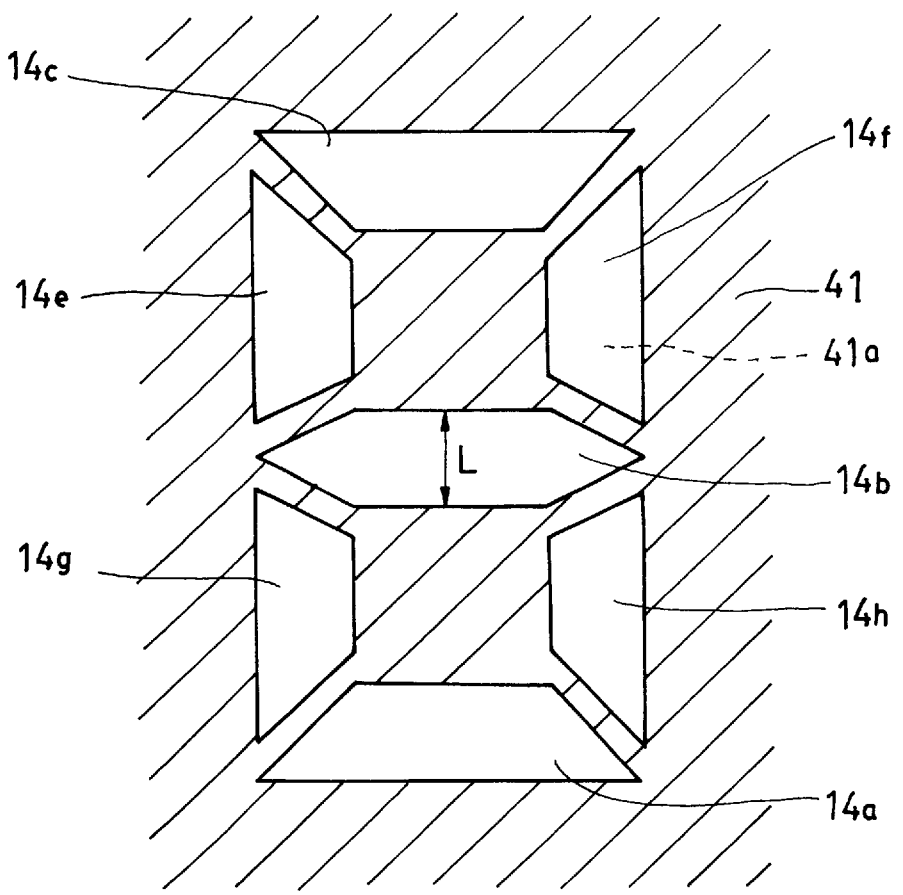
FIG. 8 is a plan view showing an arrangement of the pattern of transparent electrodes shown in FIG. 7.

The organic electroluminescent device in the third embodiment is structured to include a transparent electrode 14 as explained in the first embodiment (see FIG. 1) which is however divided into plural transparent electrode segments 14a, 14b, 14c, . . . , and the transparent electrode segments 14a, 14b, 14c, . . . are, for example, arranged in a specific pattern as shown in FIG. 8. The arrangement of an organic luminescent layer 17 and a metal electrode 19 is the same as that of the first embodiment, and a transparent substrate 12 and a diffusing plate 11 are also provided likewise the first embodiment.

Each of the transparent electrodes 14a, 14b, 14c, . . . , which are formed by dividing the transparent electrode 14 into plural segments, is connected to a power supply so as to be individually energized. When each of the transparent electrodes 14a, 14b, 14c, . . . is selectively energized, the organic luminescent layer 17 which is interposed between the energized transparent electrodes 14a, 14b, 14c, . . . and the metal electrode 19 emits light so that the patterns of characters, numerals, etc. are appropriately changed to be displayed by luminescence.

If the organic electroluminescent device is applied for displaying patterns by luminescence, the outlines of luminescent display patterns should most preferably be clear.

However, in the arrangement of the third embodiment based on the first embodiment, there occurs such a problem that the light from an organic EL body 10 radiates radially while traveling through the transparent substrate 12, and the outline of the luminescent display pattern is blurred since the transparent substrate 12 is interposed between the components.

Accordingly, in the third embodiment, a screening layer 41 for screening the light emitted from the organic EL body 10 is interposed between the transparent substrate 12 and diffusing plate 11. The screening layer 41 is formed of a thin film, which are made of various material and have the characteristics to absorb the light from the organic EL body 10. The thickness of the screening layer 41 is preferable to be sufficiently thinner than that of the transparent substrate 12 employed in the first embodiment.

The screening layer 41 is formed on the transparent substrate 12 at portions except those which confront the pattern of the transparent electrodes 14. That is, as shown in FIG. 8, the screening layer 41 has gaps 41a each having substantially the same size and shape as the pattern of the transparent electrodes 14 at portions confronting the plural transparent electrodes 14 when viewing from the direction perpendicular to planes of both the transparent substrate 12 and the screening layer 41.

The light r emitted from the organic EL body 10 radiates radially while traveling through the transparent substrate 12. However, the screening layer 41 is formed on the front surface of the transparent substrate 12, only the light which passes through the gaps 41a of the screening layer 41 enters the diffusing plate 11 and is ejected from the front surface thereof.

That is, when the light r emitted from the organic EL body 10 is controlled and reshaped by the screening layer 41, the outline of the luminescent display pattern can be clear. Although the light is dispersed while traveling through the diffusing plate 11, it is possible to obtain a luminescent display pattern which is sufficiently clear for practical use, since the light r is controlled once at an intermediate position.

Figure 9:
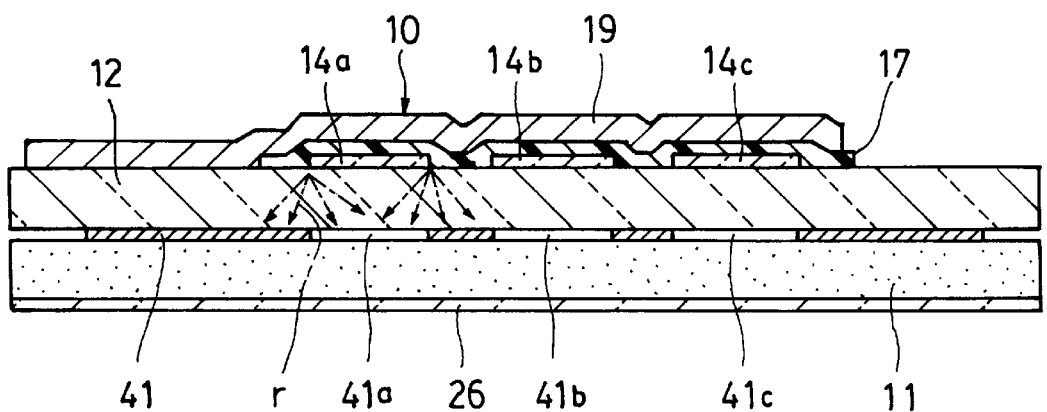
FIG. 9 is a cross sectional view of a modified example (modified example 3-1) of the third embodiment shown in FIG. 7.

FIG. 9 is a cross sectional view of a modified example (modified example 3-1) of the third embodiment shown in FIG. 7.

In addition to the same components as those shown in FIG. 7, the organic electroluminescent device in FIG. 9 is structured to include the color filter 26 formed on the front side of the diffusing plate 11.

Figure 10:
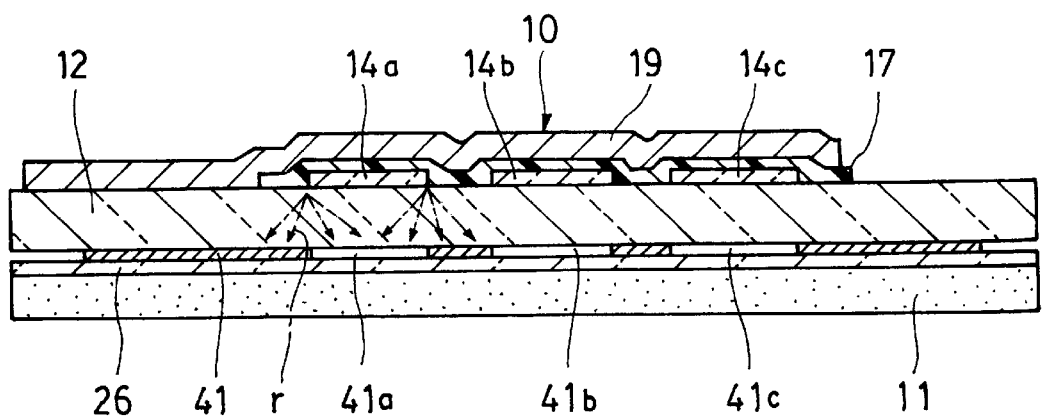
FIG. 10 is a cross sectional view of another modified example (modified example 3-2) of the third embodiment shown in FIG. 7.

FIG. 10 is a cross sectional view of another modified example (modified example 3-2) of the third embodiment shown in FIG. 7.

In addition to the same components as those shown in FIG. 7, the organic electroluminescent device in FIG. 10 is structured to include the color filter 26 formed between the diffusing plate 11 and the screening layer 41.

The arrangement and operation of the color filter 26 in each of these modified examples are the same as those explained in the modified example 1-1 or 1-2 of the first embodiment, whereby the color of the display area of the organic electroluminescent device can be arbitrarily set by the color filter 26 whenever the organic electroluminescent device emits light or not.

Even if the color filter 26 is formed on the back surface of the transparent substrate 12 (i.e., between the transparent substrate 12 and screening layer 41) in the modified example 3-2 shown in FIG. 10, the same operation and effect as those of the modified example 3-2 can be obtained.

[Fourth Embodiment]

Figure 11:
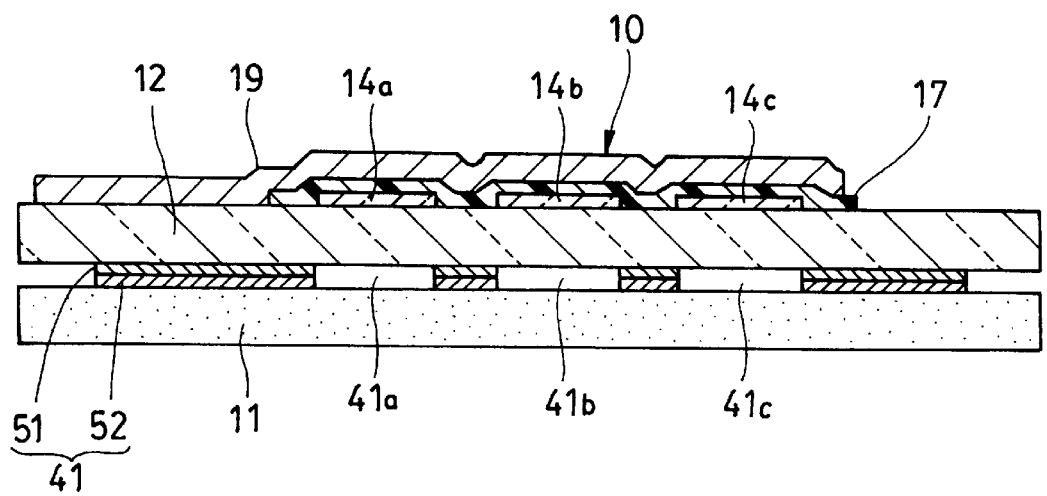
FIG. 11 is a cross sectional view of an organic electroluminescent device according to a fourth embodiment of the present invention.

FIG. 11 is a cross sectional view of an organic electroluminescent device according to a fourth embodiment of the present invention.

The fourth embodiment is characterized by an improvement of the screening layer 41 in the third embodiment (see FIG. 7) as explained above. Other components, i.e., an organic EL body 10, a transparent substrate 12 and a diffusing plate 11 are the same as those in the third embodiment, and hence the detailed explanation thereof is omitted.

The fourth embodiment is structured to include the screening layer 41 comprising a double layer formed of an absorbing layer 51 for absorbing light and a reflecting layer 52 for reflecting light.

Whereupon, the screening layer 41 has the absorbing layer 51 as the layer for receiving the light from the organic EL body 10 (layer close to the organic EL body 10) and the absorbing layer 51 is made of material having the characteristics to absorb almost all the received light without reflection.

Suppose that the layer for receiving the light from the organic EL body 10 has reflective characteristics, then the light emitted from the organic EL body and radiated radially while traveling through the transparent substrate 12 is reflected by the back surface of the screening layer 41. The reflected light enters the metal electrode 19, then it is reflected again by the metal electrode 19, and part of the light reflected again by the metal electrode 19 leaks out from the gaps 41a of the screening layer 41. As a result, the luminescent display pattern of the organic EL body 10 is not clear, thereby deteriorating the display quality. The absorbing layer 51 has a function for preventing such disadvantage.

The screening layer 41 has the reflecting layer 52 as the layer for receiving external incident light (layer close to the diffusing plate 11) and the reflecting layer 52 is made of material having the characteristics to reflect light effectively.

When the organic EL body 10 does not emit light, the environmental light enters the front side of the diffusing plate 11, passes through the gaps 41a of the screening layer 41, and is reflected by the metal electrode 19, then passes again through the gaps 41a of the screening layer 41, and travels through the diffusing plate 11 to be permitted to be ejected from the front surface thereof. The mirror of the metal electrode 19 is not visually perceived from outside due to the light diffusion by the diffusing plate 11. However, if the reflected light from the metal electrode 19, which enters the diffusing plate 11, comes from the gaps 41a of the screening layer 41 only, the light is not sufficiently diffused on the entire area of the diffusing plate 11, so that the front side of the diffusing plate is not uniform in its color and brightness. Especially under bright circumstances, the luminescent display pattern of the organic EL body 10 can be recognized even when light is not emitted.

Whereupon, when the light, whose quantity is equivalent to the light reflected from the metal electrode 19 which passes through the gaps 41a, is reflected by the reflecting layer 52, the entire area of the diffusing plate 11 is uniform in its color and brightness.

The screening layer 41 of the fourth embodiment may be formed, for example, by the following method. First, aluminum (Al) is subject to vacuum vapor deposition to be deposited in a film thickness of 0.5 $\mu$m onto an alumina ceramic sheet (diffusing plate 11) having a thickness of 0.2 mm with transmittancy of 70%. Thereafter, the Al film (reflecting layer 52) is subject to the photo-lithographic etching process to thereby form the gaps 41a at portions confronting the plural transparent electrodes 14. Successively, the absorbing layer 51 is printed on the Al film using a black pigment ink prepared by dispersing the black pigment in resin binder (i.e. a vehicle).

As a result of arrangement of the fourth embodiment, the luminescent display pattern of the organic EL body 10 is hardly recognized when the device is turned off.

Figure 12:
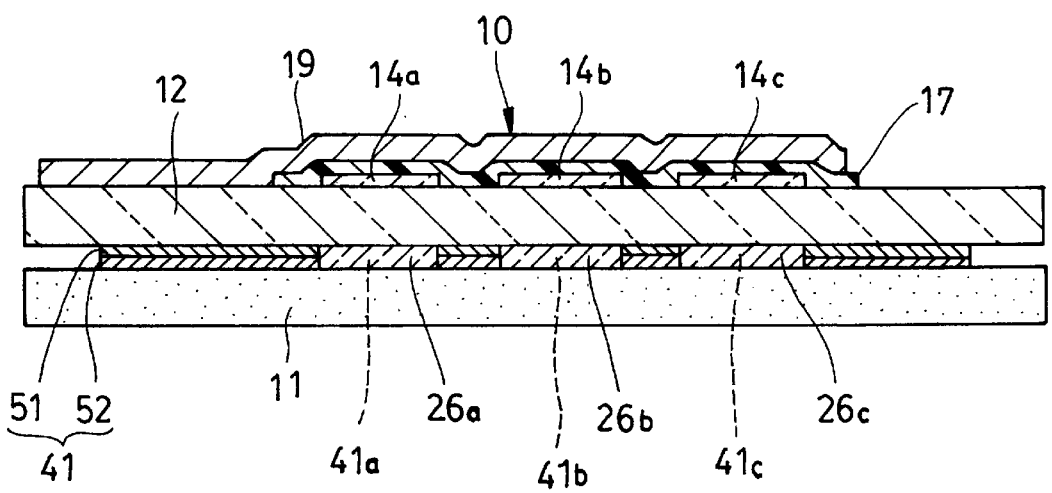
FIG. 12 is a cross sectional view of a modified example (modified example 4-1) of the fourth embodiment shown in FIG. 11.

FIG. 12 is a cross sectional view of a modified example (modified example 4-1) of the fourth embodiment shown in FIG. 11.

In addition to the same components as those in FIG. 11, the organic electroluminescent device in FIG. 12 is structured to include color filters 26a, 26b, 26c respectively formed in the gaps 41a of the screening layer 41.

Material and characteristics, etc. of the color filters 26a, 26b, 26c may be the same as those as explained in the modified examples 1-1 and 1-2. Each of the color filters 26a, 26b, 26c may be structured by different colors, as needed.

Since such color filters 26a, 26b, 26c are provided, the pattern can be displayed by luminescence of desired colors.

Even if the color filter as explained in the modified example 1-1 or 1-2 is formed on the front or back side of the diffusing plate 11, the colored luminescent display pattern can be easily realized.

[Fifth Embodiment]

Figure 13:
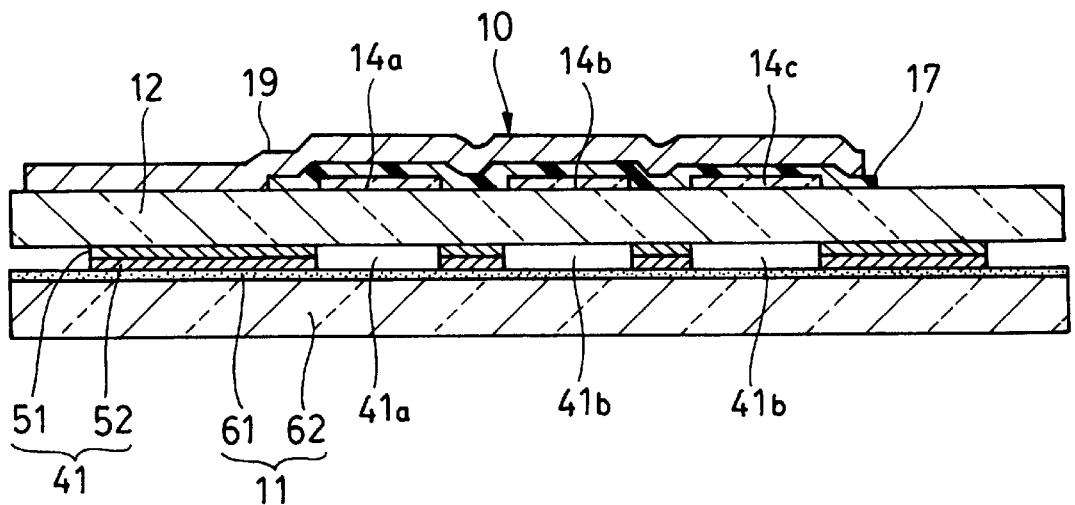
FIG. 13 is a cross sectional view of an organic electroluminescent device according to a fifth embodiment of the present invention.

FIG. 13 is a cross sectional view of an organic electroluminescent device according to a fifth embodiment of the present invention.

The organic electroluminescent device in FIG. 13 is an improvement of the diffusing plate 11 as explained in the fourth embodiment, and is structured to make the outline of the luminescent display pattern more clear when the organic EL body 10 emits light.

That is, when the light from the organic EL body 10 travels through the diffusing plate 11, it is inevitable that the outline of the luminescent display pattern is blurred due to the light diffusion by the diffusing plate 11. However, since the degree of blur of the outline corresponds to the thickness of the diffusing plate 11, the outline of the luminescent display pattern can be made more clear when the thickness of the diffusing plate 11 is thinned as much as possible. However, the diffusing plate 11 is short of strength when it is merely thinned.

Accordingly, in the fifth embodiment, the diffusing plate 11 comprises a transparent plate 62 and a thin film diffusing layer 61 formed on the back side of the transparent plate 62. The diffusing layer 61 is made of material which has a large light diffusing performance, for example, a white pigment ink prepared by dispersing the white pigment in resin binder. When the diffusing layer 61 is made of the white pigment, it appears in white or milk white in its external appearance. The transparent plate 62 is a reinforcing means of the diffusing layer 61.

Concretely, the transparent plate 62 is made of glass having a thickness of 0.2 mm, then the diffusing layer 61 made of white pigment ink is formed in the thickness of about 50 µm on the back side of the transparent plate 62. Further, the absorbing layer 51 and the reflecting layer 52 respectively constituting the screening layer 41 can be formed respectively of the black pigment ink and the silver pigment ink.

Further, the front side of the transparent plate 62 is roughened and the roughened surface may form the diffusing layer 61 as another structure of the diffusing plate 11.

Figure 14:
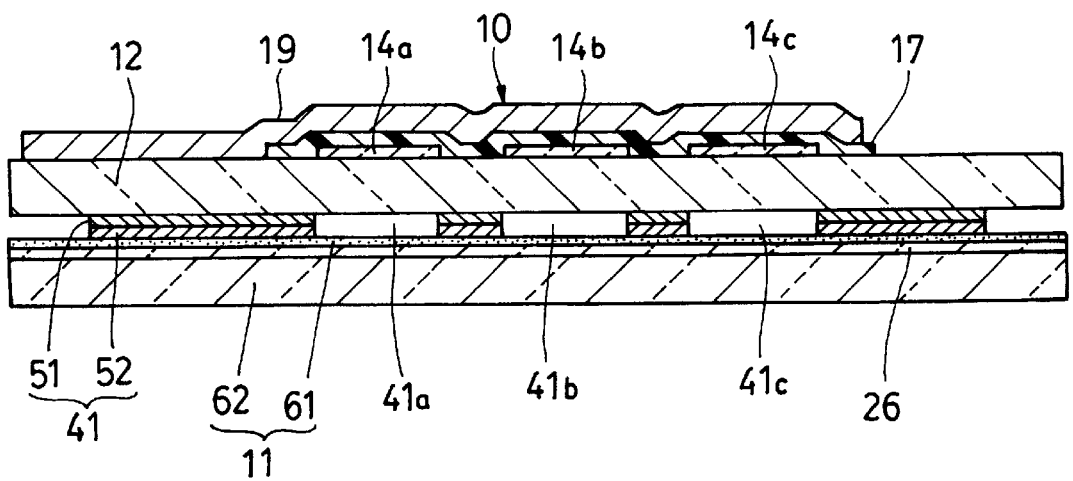
FIG. 14 is a cross sectional view showing a structure having a color filter which is added to the components of the fifth embodiment shown in FIG. 13.

It is possible to easily realize the colored luminescent display pattern if the color filter as explained in the modified example 1-1 or 1-2 is formed on the front side or back side of the transparent plate 62. FIG. 14 shows the arrangement of the color filter 26 formed on the back side of the transparent plate 62.

[Sixth Embodiment]

Figure 15:
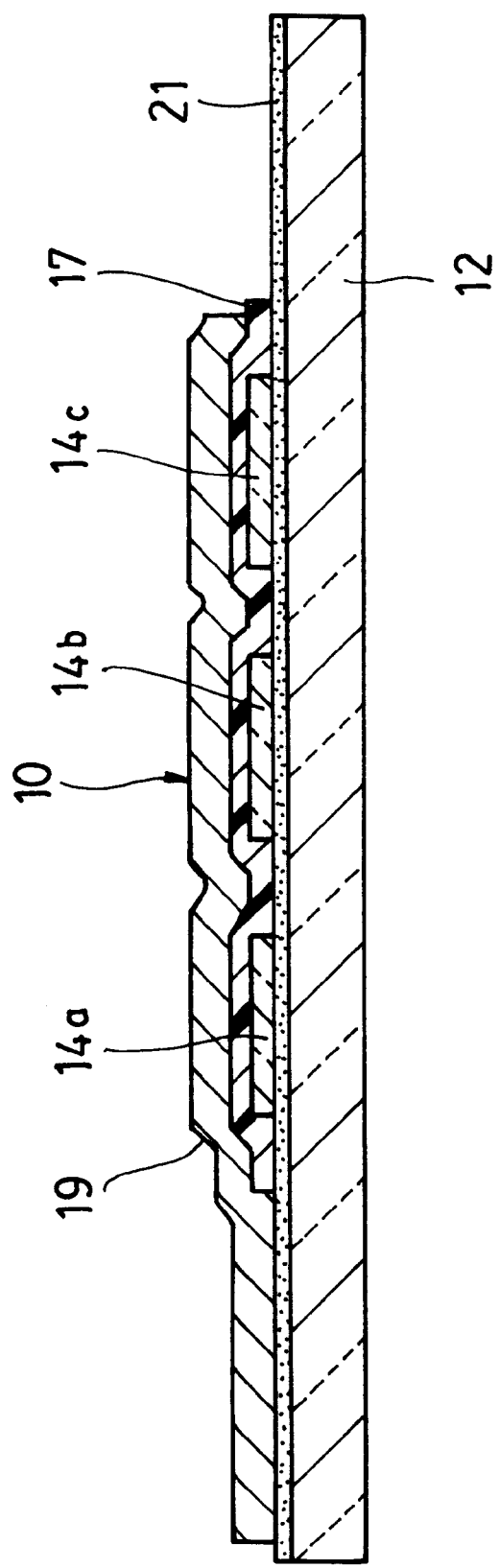
FIG. 15 is a cross sectional view of an organic electroluminescent device according to a sixth embodiment of the present invention.

FIG. 15 is a cross sectional view of an organic electroluminescent device according to a sixth embodiment of the present invention.

The electroluminescent device is structured to comprise a diffusing layer 21, transparent electrodes 14a, 14b, 14c, . . . , an organic luminescent layer 17, and a metal electrode 19 which are laminated in that order on the back surface of a transparent substrate 12 made of, e.g., non-alkali glass having a thickness of 0.3 mm.

It is possible to employ a plastic substrate, a film, etc. as the transparent substrate 12. Whereupon, since an organic EL body 10 formed on the back surface of the transparent substrate 12 has an organic luminescent layer 17 whose thickness is very thin on the order of 100 nm, if the surface on which the organic luminescent layer 17 is formed is rough, there is a likelihood of occurrence of electronic short between the transparent electrode 14 and the metal electrode 19. In view of preventing the occurrence of such an electronic short, it is preferable to form the transparent substrate 12 by a glass plate which is excellent in smoothness on the front surface thereof.

The diffusing layer 21 is formed by printing the white pigment ink, which is prepared by dispersing fine particles of titanium oxide in epoxy resin, on the back surface of the transparent substrate 12, then it is thermally hardened.

The thus obtained diffusing layer 21 has a film thickness of about 10 µm, and appears in semitransparent milk white in its external appearance, and has excellent light diffusion characteristics.

The transparent electrode 14a, 14b, 14c employ ITO (indium tin oxide) and they are formed in a given pattern by firstly forming a film having a thickness of about 100 nm on the back surface of the diffusing layer 21 by a sputtering technique, then by secondly subjecting the film to a photo-lithographic etching process.

The organic luminescent layer 17 is formed in the thickness of 120 nm by subjecting a hole injection layer (triphenylamine derivative) having a thickness of about 60 nm and a luminescent layer (aluminum chelate complex) to a continuous vacuum vapor deposition process.

The organic EL body 10 is formed by depositing the metal electrode 19, which is made of Mg—Ag (Ag content is 5%) and has a thickness of 150 nm, on the back surface of the organic luminescent layer 17 by way of a multiple vacuum vapor deposition process.

The inventors of the present invention confirmed the following experimentally. That is, it is preferable to sufficiently reduce the distance ranging from the front surface of the organic luminescent layer 17 to the front surface of the diffusing layer 21 compared with the width L (see FIG. 8) of the luminescent display pattern so as to clearly perceive the outline of the luminescent display pattern which is formed by the transparent electrodes 14a, 14b, 14c, . . . , from outside.

In the sixth embodiment, the width of the luminescent display pattern formed by the transparent electrodes 14a, 14b, 14c, . . . is set to be about 250 µm. The distance ranging from the front surface of the organic luminescent layer 17 to the front surface of the diffusing layer is determined by the sum of the thickness of the transparent electrode (about 100 nm) and the thickness of the diffusing layer (about 10 µm), which is sufficiently smaller than the width of the luminescent display pattern.

As a consequence, the outline of the luminescent display pattern can be clearly perceived from outside when the organic EL body 10 emits light. Accordingly, the organic electroluminescent device of the sixth embodiment appears in white so that the metal electrode 19 is not distinguished at all when light is not emitted, while the green luminescent display pattern having a clear outline is perceived when light is emitted.

In the arrangement of the sixth embodiment, even if the thickness of the diffusing layer is increased up to 50 µm at the maximum, the brightness of the outline of the luminescent display pattern is scarcely decreased when light is emitted.

[Seventh Embodiment]

Figure 16:
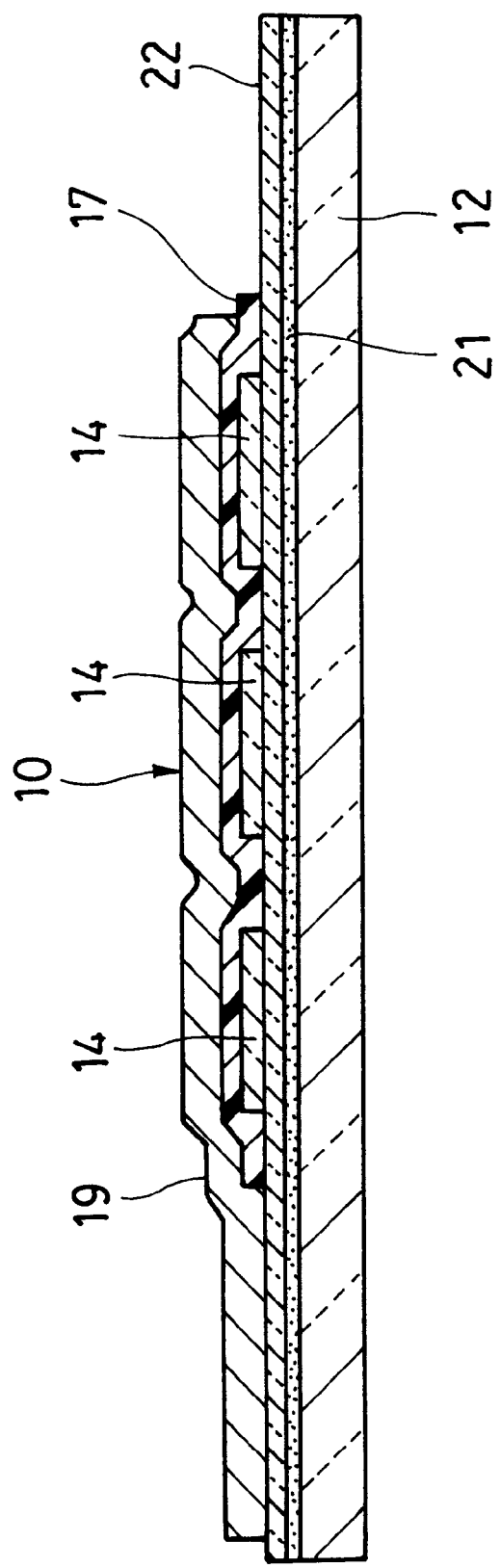
FIG. 16 is a cross sectional view of an organic electroluminescent device according to a seventh embodiment of the present invention.

FIG. 16 is a cross sectional view of an organic electroluminescent device according to a seventh embodiment of the present invention.

In addition to the same components as those of the sixth embodiment, the organic electroluminescent device of the seventh embodiment is structured to include a transparent coating layer 22. In this seventh embodiment, material and thickness of each of a transparent substrate 12, a diffusing layer 21, transparent electrodes 14a, 14b, 14c, . . . , an organic luminescent layer 17, a metal electrode 19 are the same as those of the sixth embodiment as set forth above.

The transparent coating layer 22 is formed in the thickness of 3 µm by coating the polyimide resin solution on the back surface of the diffusing layer 21 and thermally hardening the same. The transparent coating layer 22 has a first object to smooth the back surface of the diffusing layer 21 owing to thixotropic properties of the polyimide resin solution. That is, there is a likelihood of occurrence of electronic short between the transparent electrode 14 and the metal electrode 19 if the surface (back surface of the diffusing layer 21) on which the organic luminescent layer 17 is formed is rough since the organic luminescent layer 17 constituting an organic EL body 10 is generally very thin on the order of 100 nm. In view of preventing such a drawback, the back surface of the diffusing layer is smoothed by the transparent coating layer 22.

The transparent coating layer 22 has a second object to protect the diffusing layer 21 from the photo-lithographic etching process using acid during the process of forming the transparent electrodes 14a, 14b, 14c, . . . .

The transparent coating layer 22 is formed by use of a solution of polymer material such as polyacrylate or polyepoxide other than polyimide resin.

When the diffusing layer 21 is flat, the transparent coating layer 22 may be formed of an inorganic thin film which is formed on the back surface of the diffusing layer 21 by a vacuum vapor deposition technique or a spattering technique, while employing oxide or nitride such as silicon oxide, tantalum oxide, silicon nitride. The film thickness is appropriate to be 1 μm in this case.

If it is not necessary to protect the diffusing layer 21 from the photo-lithographic etching process, the transparent coating layer 22 may be formed of a very thin inorganic film having a thickness ranging from several nanometers to several tens of nanometers which is described later in the following eighth embodiment.

In the organic electroluminescent device of the seventh embodiment, the distance ranging from the front surface of the organic luminescent layer 17 to the front surface of the diffusing layer 21, which is determined by the thickness (about 100 nm) of the transparent electrodes 14a, 14b, 14c, . . . , and the thickness (about 3 μm) of the transparent coating layer 22, and the thickness (10 μm) of the diffusing layer 21 is sufficiently smaller than the width (250 μm) of the luminescent display pattern formed by the transparent electrodes 14a, 14b, 14c, . . . . As a consequence, the outline of the luminescent display pattern could be clearly perceived when the organic EL body 10 emits light.

[Eighth Embodiment]

Figure 17:
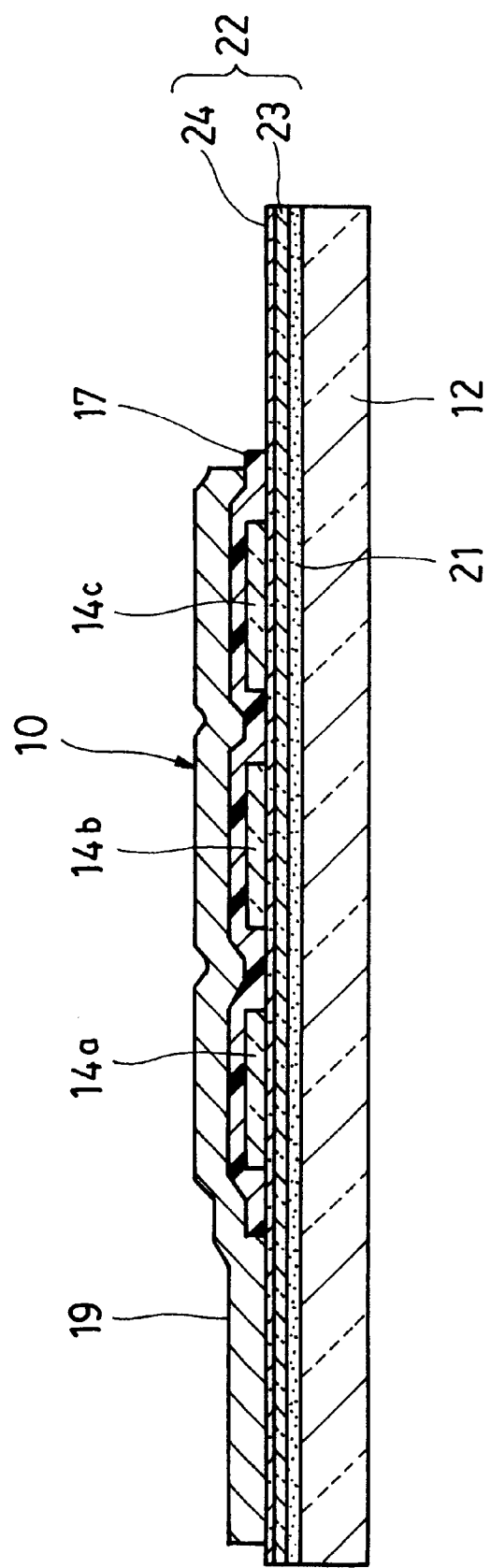
FIG. 17 is a cross sectional view of an organic electroluminescent device according to an eighth embodiment of the present invention.

FIG. 17 is a cross sectional view of an organic electroluminescent device according to an eighth embodiment of the present invention.

The organic electroluminescent device is characterized in that the transparent coating layer 22 in the seventh embodiment as mentioned above comprises a double layer formed of an organic transparent coating layer 23 and an inorganic transparent coating layer 24. In this eighth embodiment, material and thickness of a transparent substrate 12, a diffusing layer 21, transparent electrodes 14a, 14b, 14c, . . . , an organic luminescent layer 17, and a metal electrode 19 are the same as those of the seventh embodiment as set forth above.

The organic transparent coating layer 23 is formed in the thickness of about 2 μm by coating an acrylic resin solution on the back surface of the diffusing layer 21 by a spinner, then hardening it.

The organic transparent coating layer 23 has also two objects, like the transparent coating layer 22 in the seventh embodiment, namely, firstly smoothing the front surface of the diffusing layer 21 and secondly protecting the diffusing layer 21 from the photo-lithographic etching process during the process of forming the transparent electrodes 14a, 14b, 14c, . . . .

The inorganic transparent coating layer 24 is a very thin film which is made of silicon oxide and has the thickness of about 10 nm. The inorganic transparent coating layer 24 has an object to enhance etching characteristics when the transparent electrodes 14a, 14b, 14c, . . . are subject to the patterning process by photo-lithographic etching.

When the inorganic transparent coating layer 24 is formed, the transparent electrodes 14a, 14b, 14c, . . . each having a precise shape with a less overetched portion can be subject to the patterning process.

The inorganic transparent coating layer 24 is preferable to be formed of an inorganic thin film made of oxide or nitride such as silicon oxide, tantalum oxide, silicon nitride by a vacuum vapor deposition technique or a spattering technique. The experiment by the inventors of the present invention reveals that the etching characteristics is greatly improved when the film thickness ranges from several nanometers to several tens of nanometers.

According to the arrangement of the eighth embodiment, it is possible to reduce the width L (see FIG. 8) of the luminescent display pattern formed by the transparent electrodes 14a, 14b, 14c, . . . since the etching characteristics of the transparent electrodes 14a, 14b, 14c, . . . is improved. The experiment by the inventors of the present invention reveals that the width L of the luminescent display pattern can be reduced up to 80 μm.

Even in this case, the distance ranging from the back surface of the organic luminescent layer 17 to the front surface of the diffusing layer 21, namely, the sum (about 12.1 μm) of the thickness of the transparent electrodes 14a, 14b, 14c, . . . , the thickness of the organic transparent coating layer 23, the thickness of the inorganic transparent coating layer 24, and the thickness of the diffusing layer, is sufficiently smaller than the width L (80 μm) of the luminescent display pattern. Accordingly, the outline of the luminescent display pattern can be clearly perceived from outside when the organic EL body 10 emits light.

[Ninth Embodiment]

Figure 18:
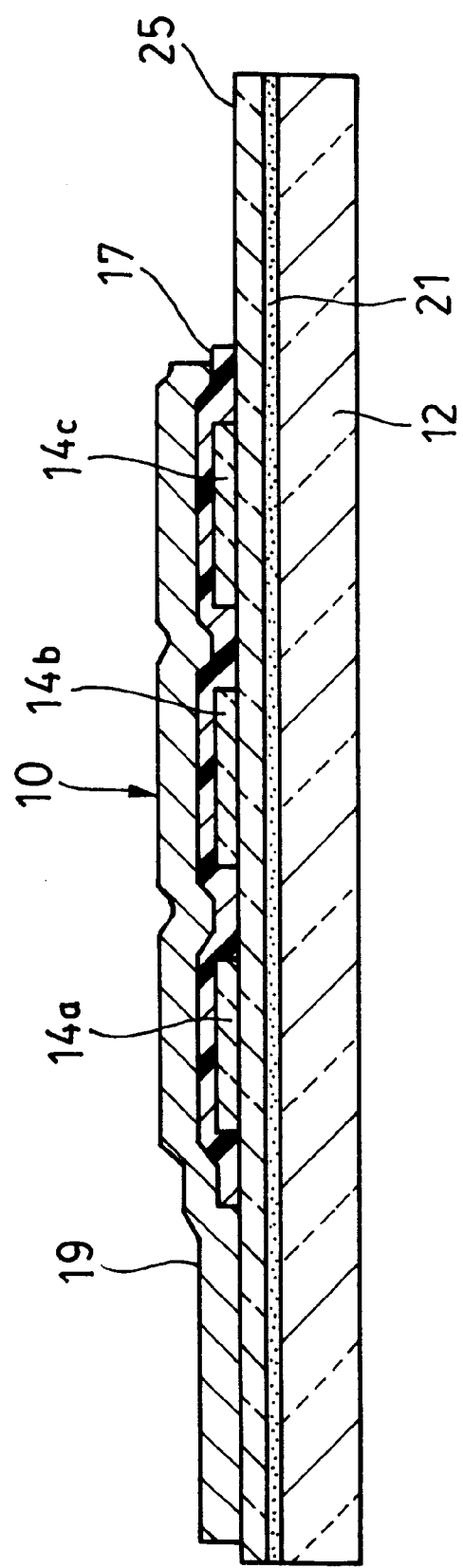
FIG. 18 is a cross sectional view of an organic electroluminescent device according to a ninth embodiment of the present invention.

FIG. 18 is a cross sectional view of an organic electroluminescent device according to a ninth embodiment of the present invention.

The organic electroluminescent device of the ninth embodiment is structured to include a transparent sheet 25 which is replaced by the transparent coating layer 22 in the seventh embodiment.

The transparent sheet 25 is formed of a thin plate of glass having a thickness ranging from 20 to 100 μm or a polymer sheet such as polyester having substantially the same thickness.

Particularly, since the thin plate of glass is excellent in smoothness if the transparent sheet 25 is formed by the thin plate of glass, the quality of an organic EL body 10 formed on the back surface of the transparent sheet 25 is stabilized, and yield thereof is improved.

Concretely, the inventors of the present invention employed the thin plate of glass which is made of non-alkali glass and has a thickness of 50 μm as the transparent sheet 25, wherein the thin plate of glass is overlaid on epoxy resin of a diffusing layer 21 when the latter is not hardened, and the diffusing layer is thermally hardened and bonded to the transparent sheet 25.

When the transparent electrodes 14a, 14b, 14c, . . . are formed of the thin plate of glass which is excellent in smoothness, etching characteristics of the transparent electrodes 14a, 14b, 14c, . . . is enhanced to the same extent as the eighth embodiment, so that the width L of the luminescent display pattern can be reduced up to 80 μm.

Even in this case, the distance ranging from the back surface of an organic luminescent layer 17 to the front surface of a diffusing layer 21, namely, the sum (about 60 μm) of the thickness of the transparent electrodes 14a, 14b, 14c, . . . , the thickness of the transparent sheet 25, and the thickness of the diffusing layer 21, is smaller than the width L (80 μm) of the luminescent display pattern. Accordingly, the outline of the luminescent display pattern can be clearly perceived from outside when the organic EL body 10 emits light.

The sharpness of the outline of the luminescent display pattern is less than that of the eighth embodiment, since the thickness of the transparent sheet 25 is slightly larger than that of the eighth embodiment, since the difference between the distance ranging from the back surface of the organic luminescent layer 17 to the front surface of the diffusing layer 21 and the width L of the luminescent display pattern is small.

There is no problem when the diffusing layer 21 is bonded to the transparent sheet 25 with an adhesive after the diffusing layer 21 is hardened.

[Tenth Embodiment]

Figure 19:
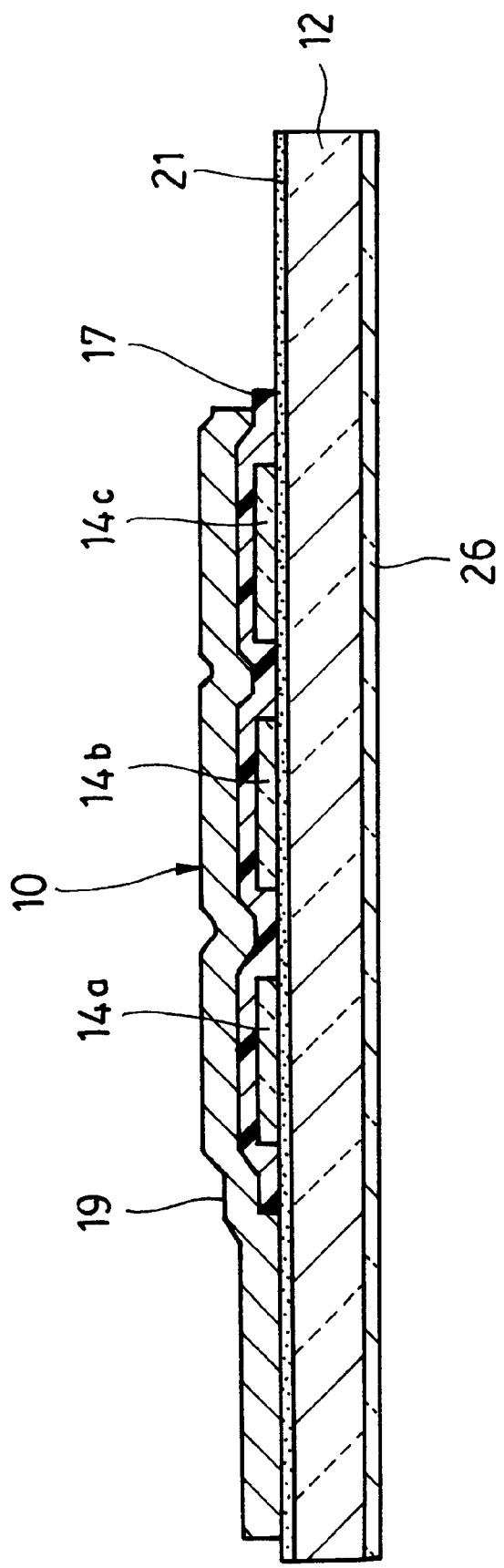
FIG. 19 is a cross sectional view of an organic electroluminescent device according to a tenth embodiment of the present invention.

FIG. 19 is a cross sectional view of an organic electroluminescent device according to a tenth embodiment of the present invention.

In addition to the same components as those of the organic electroluminescent device of the sixth embodiment (see FIG. 15), the organic electroluminescent device of the tenth embodiment is structured to include a color filter 26 made of gelatin which has a thickness of 1 μm and is dyed by green azo-type acidic dyestuff.

The color filter 26 is formed on the front surface of a transparent substrate 12. With such an arrangement, the reflected light from a metal electrode 19 is diffused by a diffusing layer 21 so that a mirror of the metal electrode 19 is concealed when an organic EL body 10 does not emit the light (i.e. when the device is turned off), so that the entire display area appears in the color (e.g., green) of the color filter 26. On the other hand, the bright and clear green luminescent display pattern can be perceived in the background of the color of the color filter 26 when the organic EL body 10 emits light.

Since the color filter 26 can be formed likewise the color filter 26 as explained in the modified example 1-1 and 1-2 of the first embodiment, and the function thereof is the same, the detailed explanation thereof is omitted.

Even if the color filter 26 is formed on the front surface of the transparent substrate 12 likewise in the seventh embodiment (see FIG. 16), the eighth embodiment (see FIG. 17), and the ninth embodiment (see FIG. 18), the same effect as set forth above can be obtained.

Figure 20:
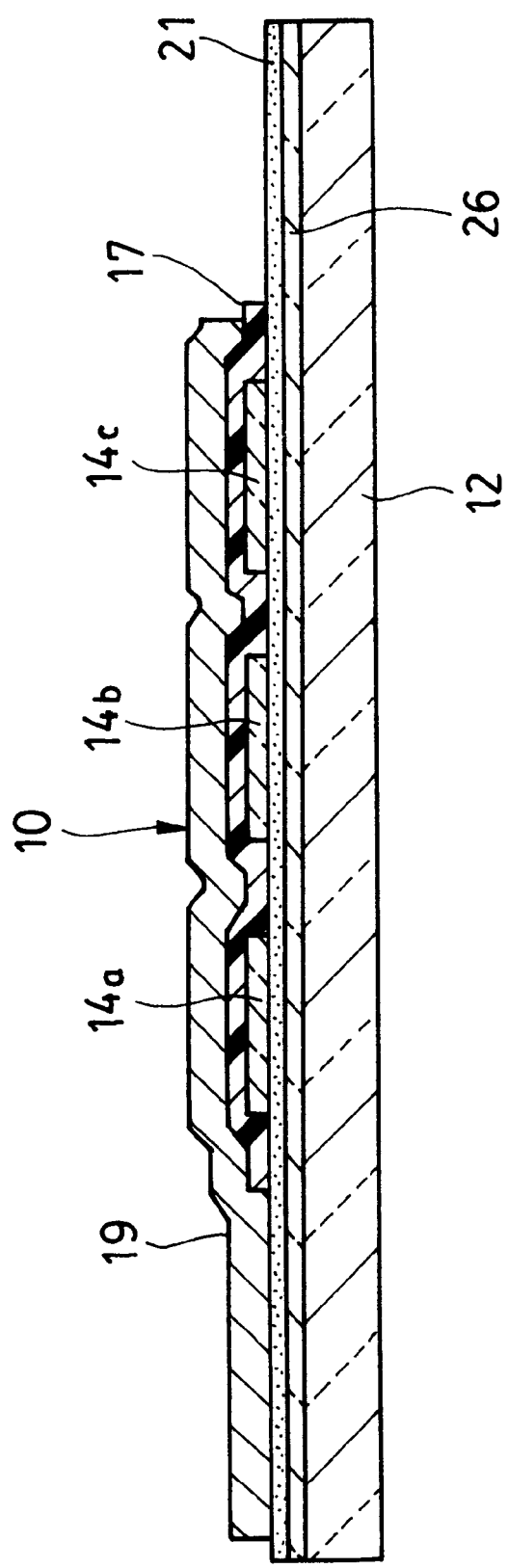
FIG. 20 is a cross sectional view of a modified example (modified example 10-1) of the tenth embodiment shown in FIG. 19.

FIG. 20 is a cross sectional view of a modified example (modified example 10-1) of the tenth embodiment shown in FIG. 19.

The organic electroluminescent device in FIG. 20 is structured to include the color filter 26 shown in FIG. 19 which is formed between the transparent substrate 12 and the diffusing layer 21 (concretely, on the back surface of the transparent substrate 12).

Even with such an arrangement, this modified example can obtain the same operation and effect as the tenth embodiment set forth above. Further, with the arrangement of this modified example forming other components (the color filter 26, diffusing layer 21, and the organic EL body 10) on one side (back side) of the transparent substrate 12, there are such advantages that the manufacturing process can be simplified and the completed organic electroluminescent device can be conveniently handled.

Even if the color filter 26 is formed between the transparent substrate 12 and the diffusing layer 21 (concretely, on the back surface of the transparent substrate 12) likewise in the seventh embodiment (see FIG. 16), the eighth embodiment (see FIG. 17), and the ninth embodiment (see FIG. 18), the same effect as set forth above can be obtained.

Although the transparent electrode is divided into plural segments in the sixth to tenth embodiments and in some of the modified examples thereof, the transparent electrode may be formed of a single piece without being divided into plural segments, as needed.

[Eleventh Embodiment]

Figure 21:
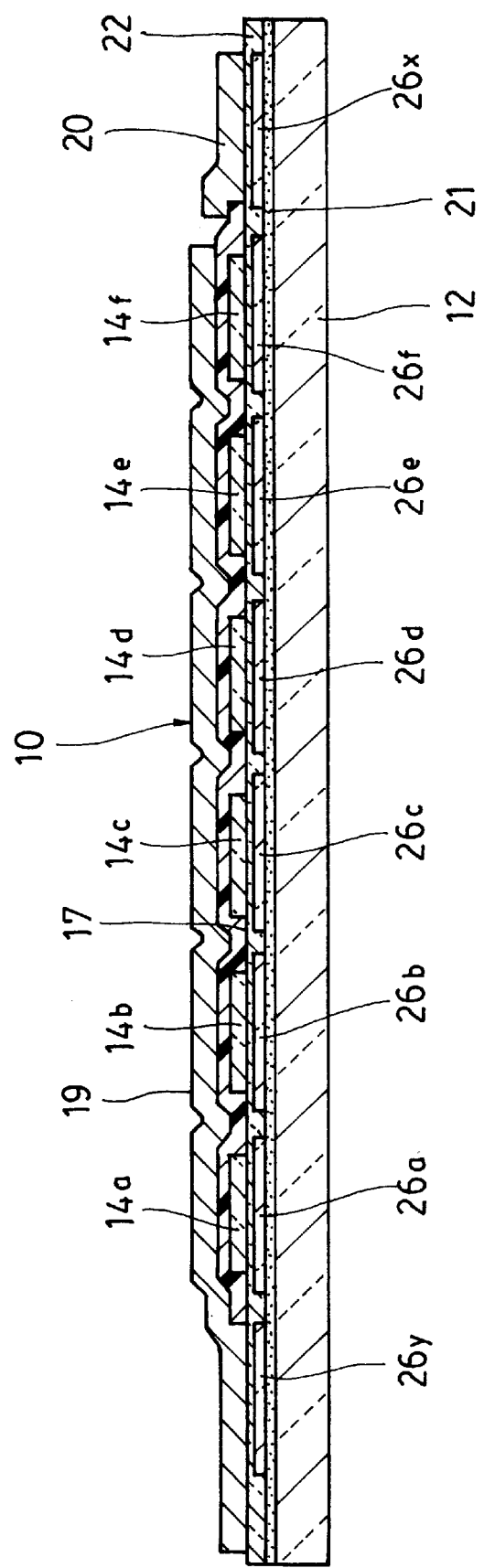
FIG. 21 is a cross sectional view of an organic electroluminescent device according to an eleventh embodiment of the present invention.

FIG. 21 is a cross sectional view of an organic electroluminescent device according to an eleventh embodiment of the present invention.

The organic electroluminescent device of the eleventh embodiment comprises a diffusing layer 21, plural color filters 26a, 26b, 26c, . . . , a transparent coating layer 22 and an organic EL body 10 which are laminated in that order on the back surface of a transparent substrate 12.

The color filters 26a, 26b, 26c, . . . are arranged at portions substantially confronting transparent electrodes 14a, 14b, 14c, . . . .

The color filters 26a, 26b, 26c, . . . may have the same color or plural different kinds of colors.

In the eleventh embodiment, the transparent electrodes 14a, 14b, 14c, . . . are arranged, for example, in a matrix, and the color filters 26a, 26b, 26c, . . . are arranged at portions substantially corresponding to the transparent electrodes 14a, 14b, 14c, . . . . The color filters 26a, 26b, 26c, . . . are plural kinds of colors which are selectively arranged with a given rule. For example, the red color filter and the yellow color filter are alternately arranged.

The thickness of each color filter is preferable to be as thin as possible so far as each color filter can be colored, and is preferable to range appropriately from 0.1 to 1 μm. Uneven portions are formed on the back surface of the diffusing layer 21 by the formation of the color filters 26a, 26b, 26c, . . . . The transparent coating layer 22 removes these uneven portions and smoothes the surface on which an organic EL body 10 is formed.

With the arrangement of the eleventh embodiment, plural color display can be realized depending on colors of the color filters 26a, 26b, 26c, . . . corresponding to the luminescent portions of the organic luminescent layer 17 even if the luminescent color of the organic luminescent layer 17 is of one kind.

That is, the color of the luminescent display pattern to be perceived becomes the color of the spectral curve that is obtained by overlapping a spectral curve of the luminescence of the organic EL body 10 and each of spectral curves of the transmittancies of the color filters 26a, 26b, 26c, . . . Such a combination of the spectral curves can be arbitrarily set depending on the object, thereby realizing the various color displays.

When the luminescent color of organic EL body 10 is almost white, the colors of the luminescent display to be perceived substantially correspond to those of the color filters 26a, 26b, 26c, . . .

In order to allow the organic EL body 10 to have the luminescent color close to white, the organic luminescent layer 17 may be formed of a film prepared by doping three fluorescent substances as the three primary colors consisting of DCM 1 (red), Coumarin 6 (green), tetraphenyl butadiene (blue) to, for example, PVK (polyvinyl carbazole).

Further, blue luminescence with a short wavelength may be employed as the organic EL body 10 and films into which the fluorescent substance is doped, wherein the fluorescent substance converts blue light to green or red may be employed as the color filters 26a, 26b, 26c.

In the organic electroluminescent device of the eleventh embodiment, the diffusing layer 21 is visible from outside so that the entire display area appears substantially in white which is the color of the diffusing layer 21 when the organic EL body 10 does not emit light.

Since the colors of the color filters 26a, 26b, 26c, . . . , though formed on the back surface of the diffusing layer 21, are also perceived to some extent, the color filters 26a, 26b, 26c, . . . are divided into small segments so that the colors of the color filters 26a, 26b, 26c, . . . are mixed with one another when they are perceived if a uniform color in the display area is desirable.

When the color filters 26a, 26b, 26c, . . . are arranged only at the portion confronting the organic EL body 10, there is a likelihood that the color is not uniform depending on the presence of the color filters 26a, 26b, 26c, . . . at the portion confronting the organic EL body 10 and at the portion confronting the peripheral portion of the organic EL body 10 when the organic EL body 10 does not emit light.

Accordingly, it is preferable to form dummy color filters 26x and 26y on the peripheral portion (the portion which does not confront the organic EL body 10) so as to allow the entire display area to have a uniform color when the organic EL body 10 does not emit light.

Since the metal electrode 19 is not present at the peripheral portion other than the portion where the organic EL body 10 is formed, the peripheral portion does not reflect the external incident light. Accordingly, the reflective condition of the light is differentiated between the portion where the metal electrode 19 is present and the peripheral portion thereof. As a consequence, the display area is not uniform in color and brightness.

Accordingly, if a reflector 20, which reflects the metallic color equivalent to that of the metal electrode 19 with equivalent reflective characteristics, is formed on the portion where it is not necessary to form the organic EL body 10, the entire display area can be made uniform in color and brightness when the organic EL body 10 does not emit light.

The reflector 20 may be formed of the same member as the metal electrode 19 or of a member which is different from the metal electrode 19. The reflector 20 may be arranged on the entire back surface of a unit comprising the transparent substrate 12, the diffusing layer 21, the color filters 26a, 26b, 26c, . . . , the transparent coating layer 22 and the organic EL body 10.

The reflector 20 may constitute a constituting element of the organic electroluminescent device in each embodiment of the present invention.

The inventors of the present invention manufactured the organic electroluminescent device having the arrangement of the eleventh embodiment as follows.

First, the diffusing layer 21 having a size of 40 mm×40 mm is formed on the center of the transparent substrate 12. Successively, blue-green color filters 26a, 26c, 26e, and 26x (width of 200 $\mu$m, length of 40 mm, thickness of 0.5 $\mu$m) of 100 in number which are prepared by dispersing blue-green phthalocyanine pigment in a photosensitive polyimide resin are formed linearly with a pitch of 400 $\mu$m.

Further, yellow color filters 26y, 26b, 26d and 26f (shape and specification are the same as those of the blue-green color filters) of 100 in number in which yellow pigment is dispersed are formed on the entire surface of the diffusing layer 21 so as to be embedded between the blue-green color filters 26a, 26c, 26e and 26x.

Patterning of these color filters is performed by UV exposure using a photomask utilizing the photo-sensitive polyimide resin. Then, the polyimide resin solution is coated on the entire region where the color filters 26a, 26b, 26c, . . . are formed, then it is thermally hardened, thereby forming the transparent coating layer 22 having a thickness of 3 $\mu$m.

Further, rectangular transparent electrodes 14a, 14b, 14c, . . . of 20 in total number each having a width of 180 $\mu$m and a length of 4 mm are formed with a pitch of 200 $\mu$m on the center of this region where the color filters 26a, 26b, 26c, . . . are formed while confronting the color filters 26a, 26b, 26c, . . .

Finally, the organic luminescent layer 17 and the metal electrode 19 are formed, and the reflector 20 is also formed by a dummy metal electrode. Particularly, the metal electrode 19 on a region which confronts leads of the transparent electrodes 14a, 14b, 14c, . . . , which are extended outside, is formed of a dummy metal electrode to which no voltage is applied, thereby restraining light from being emitted unnecessarily.

In the organic electroluminescent device manufactured in such a way, the entire display area having a size of 40 mm×40 mm appears in light green and any unevenness in color is not at all perceived when the organic EL body 10 does not emit light.

Next, when a voltage is applied to only 10 transparent electrodes 14a, 14c and 14e corresponding to the blue-green color filters 26a, 26c and 26e, thereby selectively emitting light, the square region having the size of about 4 mm×4 mm on the central portion of the display area is brightened in blue-green.

Next, when a voltage is applied to only 10 transparent electrodes 14b, 14d and 14f corresponding to the yellow color filters 26b, 26d and 26f, thereby selectively emitting light, the square region having the size of about 4 mm×4 mm on the central portion of the display area is brightened in yellow-green.

Further, when all 20 transparent electrodes 14a, 14b, 14c, . . .
ba emit light, the square region having the size of about 4 mm×4 mm on the central portion of the display area is brightened in green.

Even if the laminated film comprising the organic transparent coating layer 23 and the inorganic transparent coating layer 24 in the eighth embodiment (see FIG. 17) is employed instead of providing the transparent coating layer 22, the same effect obtained by the eleventh embodiment can be exactly achieved.

[Twelfth Embodiment]

Figure 22:
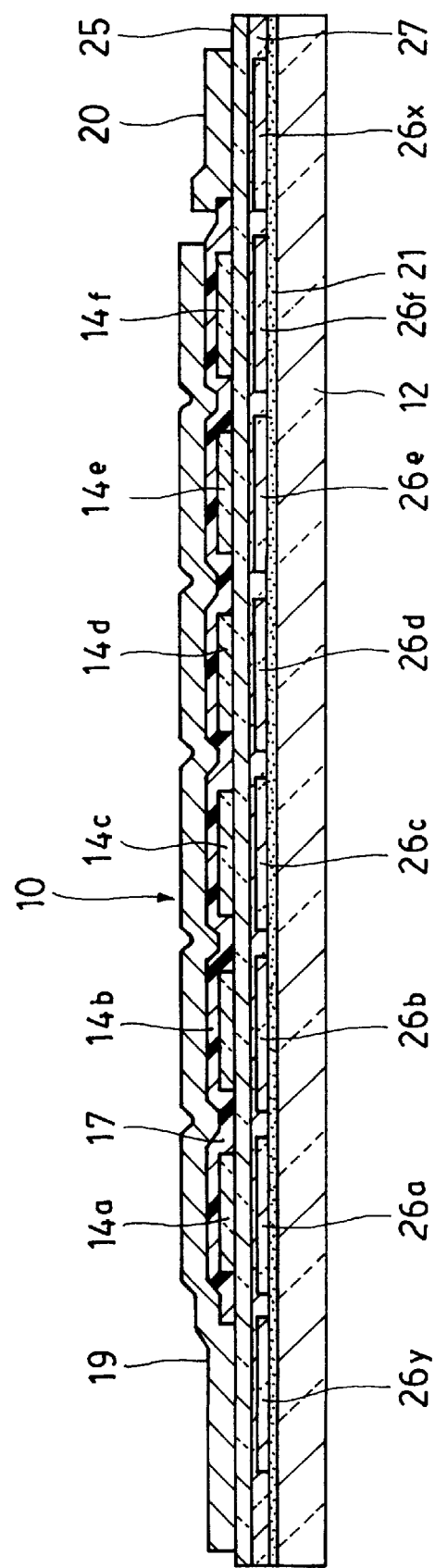
FIG. 22 is a cross sectional view of an organic electroluminescent device according to a twelfth embodiment of the present invention.

FIG. 22 is a cross sectional view of an organic electroluminescent device according to a twelfth embodiment of the present invention.

The organic electroluminescent device has the same object and effect as those of the eleventh embodiment and this object and effect can be achieved by an arrangement equivalent to that of the ninth embodiment.

The twelfth embodiment is the same as the eleventh embodiment regarding formation of color filters 26a, 26b, 26c, . . . formed on the back surface of a diffusing layer 21. Successively, a transparent sheet 25 is bonded by a bonding layer 27 as explained in the ninth embodiment. Thermal hardening or UV curing epoxy or acrylic adhesive is employed as the bonding layer 27, and the bonding layer 27 is thick enough to sufficiently absorb the step of the color filter 26.

Further, transparent electrodes 14a, 14b, 14c, . . . , an organic luminescent layer 17 and a metal electrode 19 are formed to complete the organic electroluminescent device.

The organic electroluminescent device manufactured in such a manner has the same characteristics as that of the eleventh embodiment.

The twelfth embodiment and the eleventh embodiment are respectively preferable to be structured in such a manner that the transparent electrodes 14a, 14b, 14c, . . . are arranged, in a so-called matrix, and they are driven with time sharing. That is, the twelfth and the eleventh embodiments, the color filters 26a, 26b, 26c, . . . are subdivided and arranged for uniformizing the color and brightness visually. To realize such an arrangement, the matrix structure is suitable.

[Thirteenth Embodiment]

In the organic electroluminescent device employing a diffusing plate 11 or a diffusing layer 21 in various embodiments, the diffusing plate 11 or the diffusing layer 21 can be structured to be colored with an appropriate color. As a consequence, the diffusing plate 11 or the diffusing layer 21 diffuses the reflected light from a metal electrode 19 and the diffusing plate 11 or the diffusing layer 21 appears in a colored color when the organic EL body 10 does not emit light. Further, the diffusing plate 11 or diffusing layer 21 appears in a color which is determined by the luminescent color of the organic EL body 10 and the optical characteristics of the diffusing plate 11 or diffusing layer 21 when the organic EL body 10 emits light.

That is, when the diffusing plate 11 or diffusing layer 21 is colored, the function of a color filter 26 can be given to the diffusing plate 11 or diffusing layer 21. As a result, the structure is simplified, the manufacture is facilitated, and the low manufacturing cost can be realized.

When the diffusing plate 11 or diffusing layer 21 is colored, colored dye or pigment is added to a white pigment ink, which performs the light diffusing operation, or the colored pigment ink prepared by dispersing the colored pigment alone in resins such as epoxy.

Further, when the ceramic plate is employed as the diffusing plate 11, inorganic pigment may be added to ceramic particles before shaping and baking.

[Fourteenth Embodiment]

Figure 23:
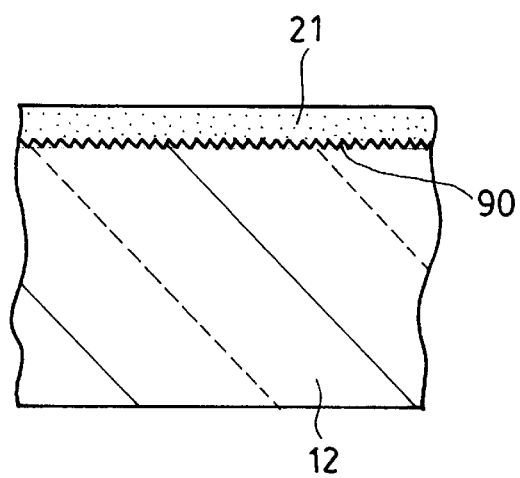
FIG. 23 is a cross sectional view of an organic electroluminescent device according to a fourteenth embodiment of the present invention.

FIG. 23 is a cross sectional view of an organic electroluminescent device according to a fourteenth embodiment of the present invention.

The fourteenth embodiment is characterized in that an interface 90 between a transparent substrate 12 and a diffusing layer 21 is finely roughened. This embodiment can be applied to various arrangements wherein the diffusing layer 21 contacts the back surface of the transparent substrate 12 to form the interface among the various embodiments as mentioned above. Meanwhile, since a transparent plate 62 operates like the transparent substrate 12, this embodiment can be likewise applied to the fifth embodiment (see FIGS. 13 and 14).

It is preferable that the interface 90 is formed of a rough surface having an uneven portion whose height is 1 $\mu$m which can be however adjusted arbitrarily within the range of 0.1 to 10 $\mu$m.

To roughen the interface 90, for example, the transparent substrate 12 is subject to a photo-lithographic etching process or a blast process.

With such an arrangement, a mirror reflection of light at the interface 90 between the back surface of the transparent substrate 12 and the diffusing layer 21 is restrained, thereby forming the display area having no luster and causing the impression of soft feeling.

As a modified example of the fourteenth embodiment, the interface between the back surface of the transparent substrate 12 and a color filter 26 or the interface between the front surface of the diffusing layer 21 and the color filter 26 can be formed of a rough surface. As a result, the mirror reflection of the light on these interfaces is reduced, thereby forming the display area having no luster and causing the impression of soft feeling.

It is needless to say that this modified example can be applied to the organic electroluminescent device of the various embodiments having the interface between the back surface of the transparent substrate 12 and the color filter 26 or the interface between the front surface of the diffusing layer 21 and the color filter 26.

In this case, the interface between the transparent substrate 12 and the color filter 26 can be realized by roughening the front surface of the transparent substrate 12. Further, the interface between the color filter 26 and the diffusing layer 21 can be roughened by subjecting the front surface of the color filter 26 to vapor phase photo-lithographic etching process by means of a plasma etch process or impressing the color filter 26 in a semi-hardened state during the formation thereof by a metal mold.

[Fifteenth Embodiment]

Figure 24:
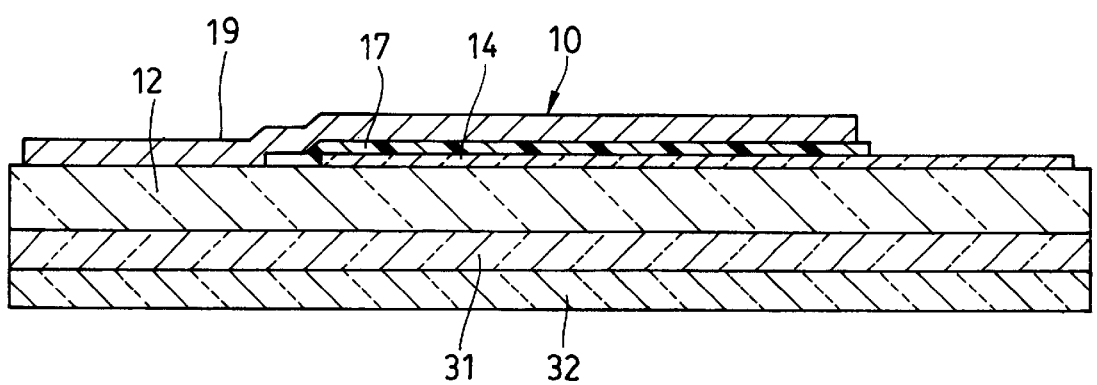
FIG. 24 is a cross sectional view of an organic electroluminescent device according to a fifteenth embodiment of the present invention.

FIG. 24 is a cross sectional view of an organic electroluminescent device according to a fifteenth embodiment of the present invention.

The organic electroluminescent device of the fifteenth embodiment comprises an organic EL body 10 consisting of a transparent electrode 14, an organic luminescent layer 17 and a metal electrode 19 which are laminated in that order on the back surface of a transparent substrate 12. This basic structure is the same as, for example, that of the first embodiment as set forth above.

The fifteenth embodiment is characterized in that a phase plate 31 and a polarizing plate 32 are added to the basic structure as set forth above. The phase plate 31 is formed on the front surface of the transparent substrate, and the polarizing plate 32 is formed on the front side of the phase plate 31.

The phase plate 31 and polarizing plate 32 function to screen the light which entered from outside and is reflected by the metal electrode 19.

As the phase plate 31, a $\pi/4$ plate is most preferable since it is excellent in screening characteristics. A sheet, which is prepared by extending, e.g., polycarbonate having a thickness of 0.1 mm, can be used as the phase plate 31. As the polarizing plate 32, a sheet which is prepared by drawing, e.g., polyvinyl acetate having a thickness of 0.2 mm and doping iodine thereinto can be employed. Thereafter, these sheets are bonded with each other while adjusting the angle between the extended axes of these sheets to $\pi/4$.

According to the organic electroluminescent device having such an arrangement, only the linearly polarized light component of the external light entering the polarizing plate 32 travels therethrough, and is changed to circularly polarized light by the phase plate 31.

The circularly polarized light travels successively through the transparent substrate 12, the transparent electrode 14 and the organic luminescent layer 17, then it is reflected by the metal electrode 19, then travels again through the organic luminescent layer 17, the transparent electrode 14 and the transparent substrate 12, and it is finally changed to linearly polarized light by the phase plate 31.

However, since the polarization direction of this linearly polarized light is perpendicular to that of the polarizing plate, the light does not pass through the polarizing plate 32. Accordingly, the display area is dark and appears substantially in black when the organic EL body 10 does not emit light, and hence the metal electrode 19 is not at all visible. Further, the light from the organic EL body 10 is not polarized when the organic EL body 10 emits light, about half of the light from the organic EL body 10 travels through the phase plate 31 and polarizing plate 32, thereby forming a green transparent luminescent surface. As a result, the contrast is very clear when the organic EL body 10 emits light or not, thereby ensuring a high quality of luminescent display.

INDUSTRIAL UTILIZATION

Since the organic electroluminescent device of the present invention can form an external appearance causing the impression of high quality while the display area does not look like the mirror when light is not emitted, it can be applied to the luminescent display portion of various electric apparatuses, the face of a watch, etc. so as to enhance the added values of these products.

We claim:

1. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being formed on a back surface side of a transparent substrate, and the organic electroluminescent device further including a diffusing plate formed on a front surface side of the transparent substrate and having light diffusion characteristics, said device further including a color filter provided at a front surface side of the diffusing plate, the color filter transmitting light whose color is the same as that of the light emitted from the organic electroluminescent body.

2. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being formed on a back surface side of a transparent substrate, and the organic electroluminescent device further including a diffusing plate formed on a front surface side of the transparent substrate and having light diffusion characteristics, said device further including a color filter provided at a front surface side of the diffusing plate, the color filter emitting fluorescence.

3. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being formed on a back surface side of a diffusing plate, the diffusing plate having light diffusion characteristics, said device further including a color filter provided at a front surface side or the back surface side of the diffusing plate, the color filter transmitting light whose color is the same as that of the light emitted from the organic electroluminescent body.

4. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being formed on a back surface side of a diffusing plate, the diffusing plate having light diffusion characteristics, said device further including a color filter provided at a front surface side or the back surface side of the diffusing plate, the color filter emitting fluorescence.

5. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being divided into plural segments to form plural transparent electrodes and formed on a back surface side of a transparent substrate, and the organic electroluminescent device further including a diffusing plate formed on a front surface side of the transparent substrate and having light diffusion characteristics, said device further including a screening layer formed between the transparent substrate and the diffusing plate at least outside of the area that confronting the plural transparent electrodes, the screening layer screening light, the screening layer comprising a reflecting layer for reflecting light and an absorbing layer for absorbing light, wherein the reflecting layer is formed on a front side of the screening layer and the absorbing layer is formed on a back side of the screening layer.

6. An organic electroluminescent device according to claim 5, further including a color filter formed on a front surface side of the diffusing plate, the color filter transmitting light and having a given distribution of transmittancy to a wavelength of light.

7. An organic electroluminescent device according to claim 5, further including a color filter provided between the diffusing plate and the transparent substrate, the color filter transmitting light and having a given distribution of transmittancy to a wavelength of light.

8. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being divided into plural segments to form plural transparent electrodes and formed on a back surface side of a transparent substrate, and the organic electroluminescent device further including a diffusing plate formed on a front surface side of the transparent substrate and having light diffusion characteristics, said device further including a screening layer formed between the transparent substrate and the diffusing plate at least outside of the area that confronting the plural transparent electrodes, the screening layer screening light, wherein the screening layer has gaps and the device further includes color filters formed in the gaps of the screening layer at portions confronting each of the transparent electrodes, each color filter transmitting light and having a given distribution of transmittancy to a wavelength of light.

9. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being formed on a back surface side of a transparent substrate, and the organic electroluminescent device further including a diffusing plate formed on a front surface side of the transparent substrate and having light diffusion characteristics, the transparent electrode being divided into plural segments to form plural transparent electrodes, and the organic electroluminescent device further including a screening layer formed between the transparent substrate and the diffusing plate at least outside of the area that confronting the plural transparent electrodes, the screening layer screening light, wherein the diffusing plate comprises a transparent plate which transmits light and a thin film diffusing layer formed on a side of the transparent plate confronting the screening layer.

10. An organic electroluminescent device according to claim 9, further including a color filter provided at a front surface side or a back surface side of the transparent plate, the color filter transmitting light whose color is the same as that of the light emitted from the organic electroluminescent body.

11. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being divided into plural segments to form plural transparent electrodes and formed on a back surface side of a transparent substrate, and the organic electroluminescent device further including a thin film diffusing layer formed between the transparent substrate and the transparent electrode, the diffusing layer having light diffusion characteristics, further including a color filter provided at a front surface side of the transparent substrate, the color filter transmitting light whose color is the same as that of the light emitted from the organic electroluminescent body.

12. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being divided into plural segments to form plural transparent electrodes and formed on a back surface side of a transparent surface, and the organic electroluminescent device further including a thin film diffusing layer formed between the transparent substrate and the transparent electrode, the diffusing layer having light diffusion characteristics, further including a color filter provided at a front surface side of the transparent substrate, the color filter emitting fluorescence.

13. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being divided into plural segments to form plural transparent electrodes and formed on a back surface side of a transparent substrate, and the organic electroluminescent device further including a thin film diffusing layer formed between the transparent substrate and the transparent electrode, the diffusing layer having light diffusion characteristics, further including a transparent sheet made of a thin plate of glass between the diffusing layer and each of the transparent electrodes.

14. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being divided into plural segments to form plural transparent electrodes and formed on a back surface side of a transparent substrate, and the organic electroluminescent device further including a thin film diffusing layer formed between the transparent substrate and the transparent electrode, the diffusing layer having light diffusion characteristics, further including a transparent coating layer formed on the back surface side of the diffusing layer for smoothing each surface on which the transparent electrode is formed, further including color filters provided between the diffusing layer and the transparent coating layer at least at portions confronting each of the transparent electrodes, the color filters transmitting light and having a given distribution of transmittancy to a wavelength of light.

15. An organic electroluminescent device according to claim 14, wherein the color filters are disposed at different positions and different kinds of color filters transmitting light and having different distributions of intensities to wavelengths of light.

16. An organic electroluminescent device according to claim 13, further including color filters provided between the diffusing layer and the transparent sheet at least at portions confronting each of the said plural transparent electrodes, the color filters transmitting light and having a given distribution of transmittancy to a wavelength of light, wherein adhesive is filled around each of the color filters to bond the transparent sheet.

17. An organic electroluminescent device according to claim 16, wherein the color filters are disposed at different positions and different kinds of color filters transmitting light and having different distributions of intensities to wavelengths of light.

18. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being formed on a back surface side of a transparent substrate, and the organic electroluminescent device further including a diffusing plate formed on a front surface side of the transparent substrate and having light diffusion characteristics, further including a color filter provided between the diffusing plate and the transparent substrate, the color filter transmitting light whose color is the same as that of the light emitted from the organic electroluminescent body.

19. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being formed on a back surface side of a transparent substrate, and the organic electroluminescent device further including a diffusing plate formed on a front surface side of the transparent substrate and having light diffusion characteristics, further including a color filter provided between the diffusing plate and the transparent substrate, the color filter emitting fluorescence.

20. An organic electroluminescent device according to claim 5, further including a color filter provided at the front surface side of the diffusing plate, the color filter emitting fluorescence.

21. An organic electroluminescent device according to claim 5, further including a color filter provided between the diffusing plate and the transparent substrate, the color filter emitting fluorescence.

22. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being divided into plural segments to form plural transparent electrodes and formed on a back surface side of a transparent substrate, and the organic electroluminescent device further including a diffusing plate formed on a front surface side of the transparent substrate and having light diffusion characteristics, further including a screening layer formed between the transparent substrate and the diffusing plate at least outside of area that confronting the plural transparent electrodes, the screening layer screening light, wherein the screening layer has gaps and the device further includes color filters formed in gaps of the screening layer at portions confronting each of the transparent electrodes, each color filter emitting fluorescence.

23. An organic electroluminescent device according to claim 9, further including a color filter provided at a front surface side or a back surface side of the transparent plate, the color filter emitting fluorescence.

24. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being divided into plural segments to form plural transparent electrodes and formed on a back surface side of a transparent substrate, and the organic electroluminescent device further including a thin film diffusing layer formed between the transparent substrate and the transparent electrode, the diffusing layer having light diffusion characteristics, further including a color filter provided between the transparent substrate and the diffusing plate, the color filter transmitting light whose color is the same as that of the light emitted from the organic electroluminescent body.

25. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being divided into plural segments to form plural transparent electrodes and formed on a back surface side of a transparent substrate, and the organic electroluminescent device further including a thin film diffusing layer formed between the transparent substrate and the transparent electrode, the diffusing layer having light diffusion characteristics, further including a color filter provided between the transparent substrate and the diffusing plate, the color filter emitting fluorescence.

26. An organic electroluminescent device comprising an organic electroluminescent body including a transparent electrode formed on a front surface side of an organic luminescent layer and a metal electrode formed on a back surface side of the organic luminescent layer, the organic electroluminescent body emitting light when a voltage is applied thereto, the transparent electrode of the organic electroluminescent body being divided into plural segments to form plural transparent electrodes and formed on a back surface side of a transparent substrate, and the organic electroluminescent device further including a thin film diffusion layer formed between the transparent substrate and the transparent electrode, the diffusing layer having light diffusion characteristics, further including a transparent coating layer formed on the back surface side of the diffusing layer for smoothing each surface on which the transparent electrode is formed, further including color filters provided between the diffusing layer and the transparent coating layer at least at portions confronting each of the transparent electrodes, the color filters emitting fluorescence.

27. An organic electroluminescent device according to claim 26, wherein the color filters are disposed at different positions and different kinds of color filter emitting fluorescence having different distributions of intensities to the wavelengths of light.

28. An organic electroluminescent device according to claim 13, further including color filters provided between the diffusing layer and the transparent sheet at least at portions confronting each of the said plural transparent electrodes, the color filters emitting fluorescence, wherein adhesive is filled around each of the color filters to bond the transparent sheet.

29. An organic electroluminescent device according to claim 28, wherein the color filters are disposed at different positions and different kinds of color filter emitting fluorescence having different distributions of intensities to the wavelengths of light.

\* \* \* \* \*